United States Patent [19]
Bulucea et al.

[11] Patent Number: 5,548,158
[45] Date of Patent: Aug. 20, 1996

[54] STRUCTURE OF BIPOLAR TRANSISTORS WITH IMPROVED OUTPUT CURRENT-VOLTAGE CHARACTERISTICS

[75] Inventors: Constantin Bulucea, Milpitas; Michael J. Grubisich, San Jose, both of Calif.

[73] Assignee: National Semiconductor Corporation, Santa Clara, Calif.

[21] Appl. No.: 300,498

[22] Filed: Sep. 2, 1994

[51] Int. Cl.$^6$ .......................... H01L 27/082; H01L 29/00; H01L 27/102
[52] U.S. Cl. .......................... 257/592; 257/558; 257/564
[58] Field of Search ..................................... 257/592, 593, 257/587, 588, 557, 564, 607, 558, 560, 561, 563

[56] References Cited

U.S. PATENT DOCUMENTS

| | | | |
|---|---|---|---|
| 4,512,816 | 4/1985 | Ramde et al. | 437/15 T |
| 5,006,476 | 4/1991 | De Jong et al. | 257/592 |
| 5,079,182 | 1/1992 | Ilderem et al. | 257/592 |

OTHER PUBLICATIONS

Iranmanesh et al, "A 0.8-μm Advanced Single-Poly BiCMOS Technology for High-Density and High-Performance Applications," *IEEE J. Solid-State Circs.*, Mar. 1991, pp. 422–426.

Rein et al, "A Semi-Physical Bipolar Transistor Model for the Design of Very-High-Frequency Analog ICs," 1992 Bipolar/BiCMOS Circs. and Tech. Meet., 7–8 Oct. 1992, pp. 217–220.

Blicher, *Field–Effect and Bipolar Power Transistor Physics* (Academic Press), 1981, pp. 114–117.

Sze, *Semiconductor Devices, Physics and Technology* (John Wiley & Sons), 1985, pp. 134–139.

Tang et al, "Design Considerations of High–Performance Narrow–Emitter Bipolar Transistors," *IEEE Electron Dev. Lett.*, Apr. 1987, pp. 174–175.

Lu et al, "Lateral Encroachment of Extrinsic–Base Dopant i Submicrometer Bipolar Transistors," *IEEE Electron Dev. Lett.*, Oct. 1987, pp. 496–498.

Muller et al, *Device Electronics for Integrated Circuits* (John Wiley & Sons), 1977, pp. 241–245.

Philips, *Transistor Engineering* (McGraw–Hill, reprinted Robert E. Krieger Pub. Co., 1981), 1962, pp. 298–304.

Warner et al, *Transistor Fundamentals for the Integrated–Circuit Engineer* (John Wiley & Sons), 1983, pp. 559–562.

Grove, *Physics and Technology of Semiconductor Devices* (John Wiley & Sons), 1977, pp. 228–230.

*Primary Examiner*—Wael M. Fahmy
*Attorney, Agent, or Firm*—Skjerven Morrill MacPherson Franklin & Friel; Ronald J. Meetin

[57] ABSTRACT

A special two-dimensional intrinsic base doping profile is utilized to improve the output current-voltage characteristics of a vertical bipolar transistor whose intrinsic base includes a main intrinsic portion. The special doping profile is achieved with a pair of more lightly doped base portions that encroach substantially into the intrinsic base below the main intrinsic base portion. The two deep encroaching base portions extend sufficiently close to each other to set up a two-dimensional charge-sharing mechanism that typically raises the magnitude of the punch-through voltage. The transistor's current-voltage characteristics are thereby enhanced.

22 Claims, 27 Drawing Sheets

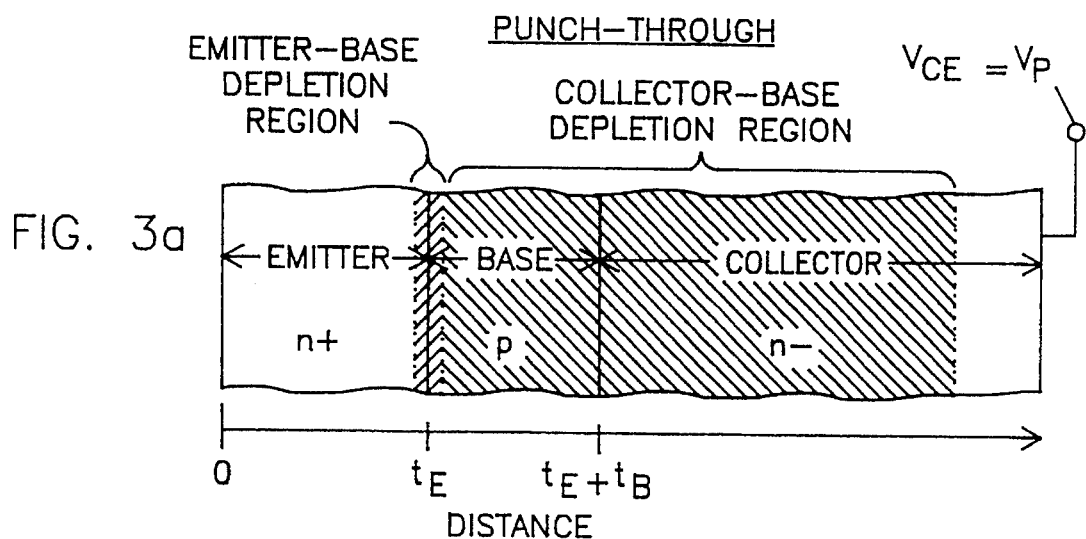
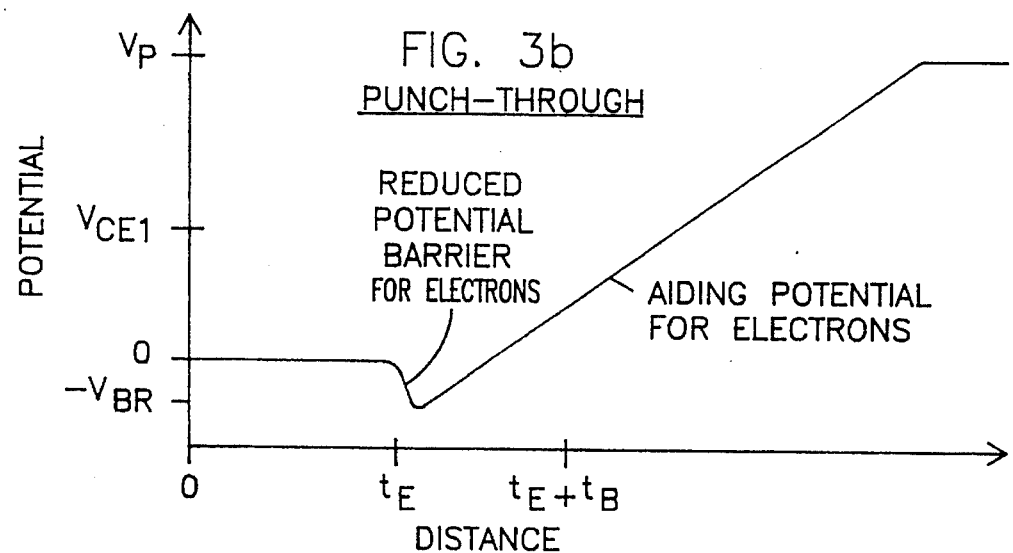
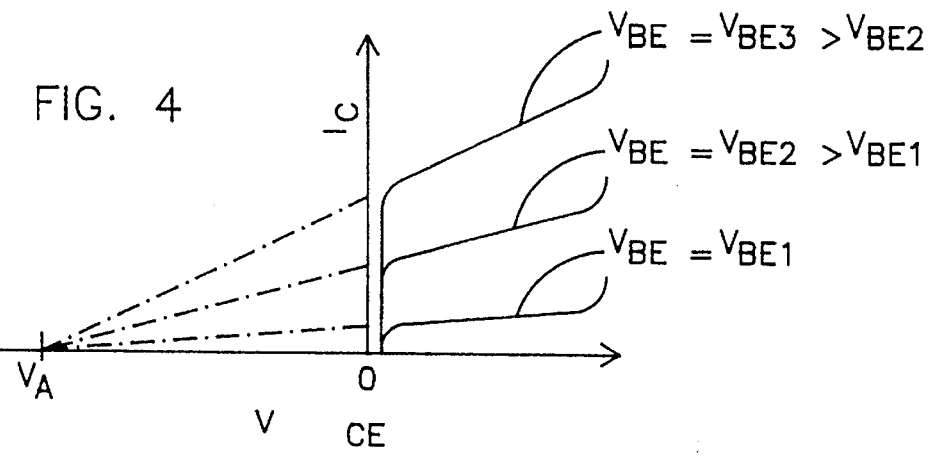

$V_{CE} = 1.0V$   $\Delta V = 0.04V$ $V_{CE} = 5.0V$   $\Delta V = 0.1V$ $V_{CE} = 12.0V$   $\Delta V = 0.2V$ $V_{CE} = 1.0V$  $\Delta I = 5\%$ $V_{CE} = 5.0V$  $\Delta I = 5\%$ $V_{CE} = 12.0V$  $\Delta I = 5\%$

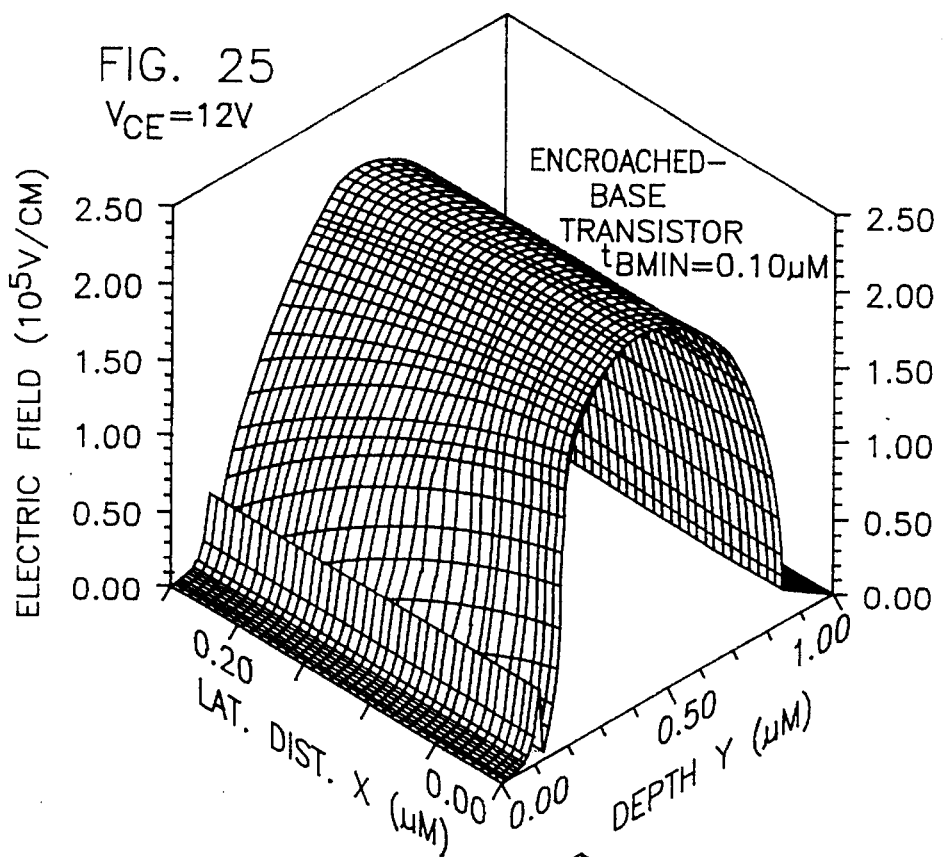
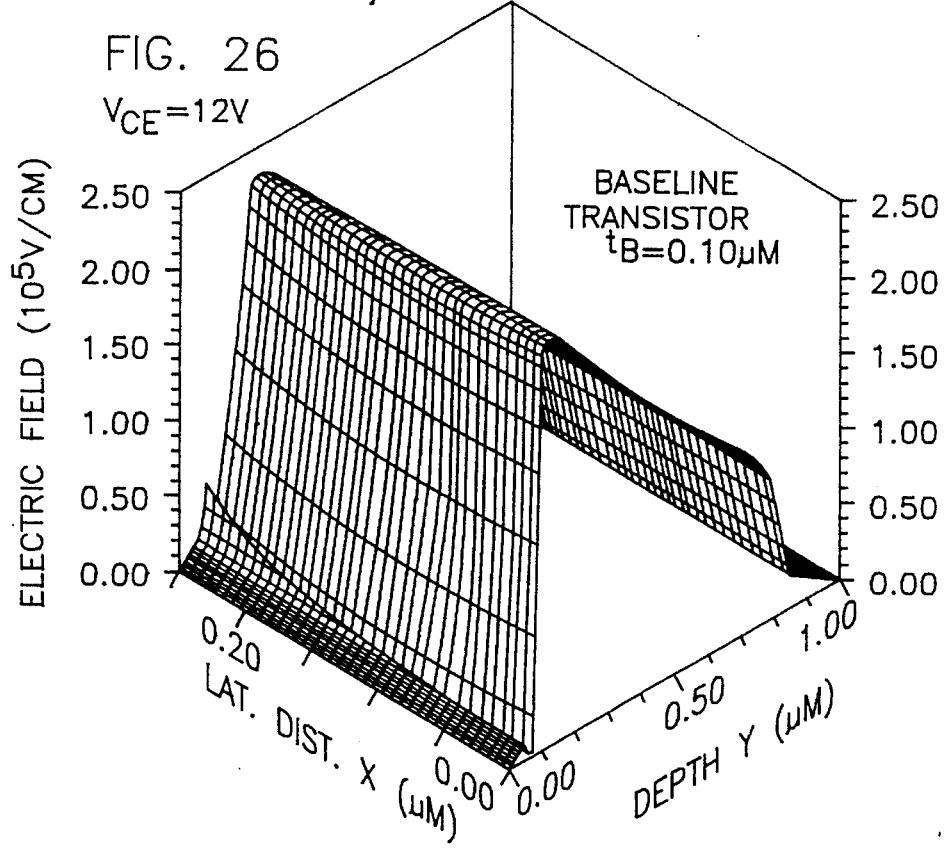

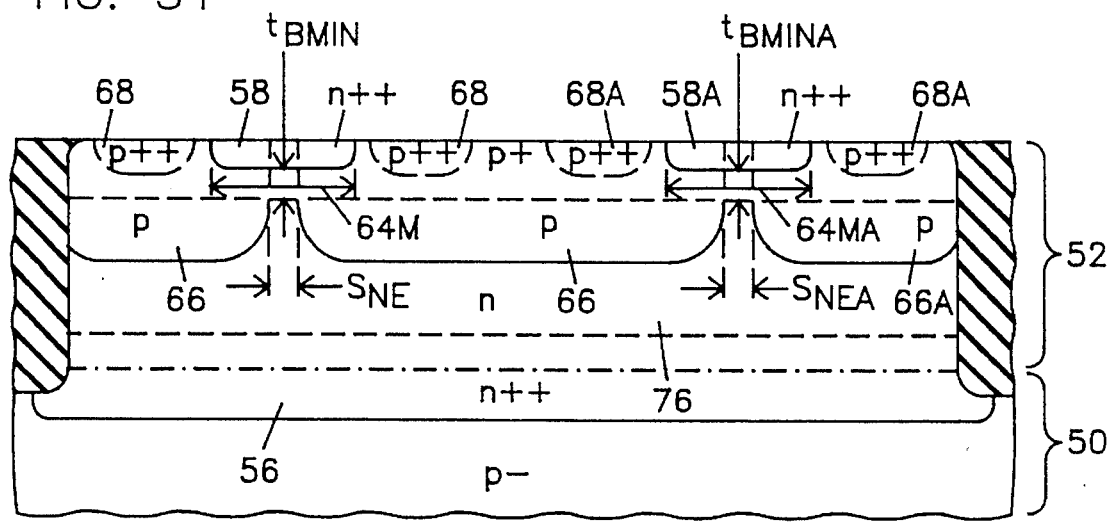
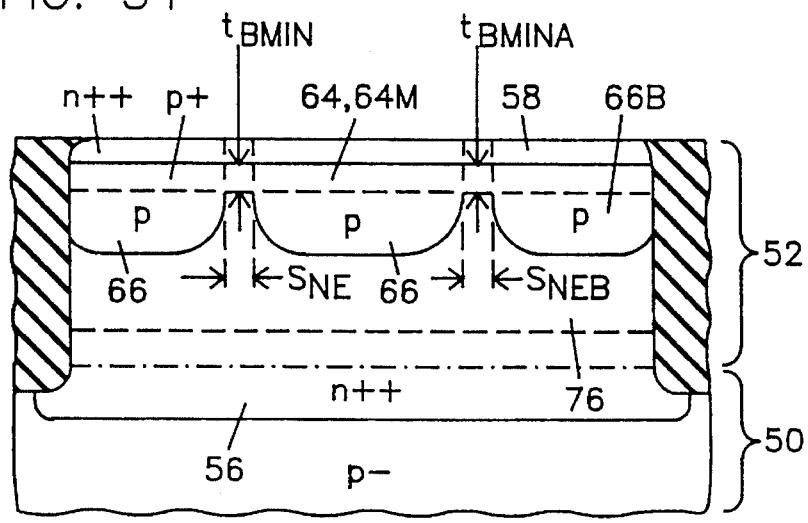

5,548,158

STRUCTURE OF BIPOLAR TRANSISTORS WITH IMPROVED OUTPUT CURRENT-VOLTAGE CHARACTERISTICS

FIELD OF USE

This invention relates to semiconductor devices. More particularly, this invention relates to bipolar transistors, including structures and methods for fabricating bipolar transistors.

BACKGROUND

A bipolar transistor formed with an emitter, collector, and intervening base is typically created in a vertical arrangement along a major surface, referred to here (for convenience) as the upper surface, of a monocrystalline semiconductor body. The emitter, collector, and base are all situated in the semiconductor body. The emitter adjoins the body's upper surface.

The base consists of an intrinsic part (commonly referred to as the "intrinsic base") and one or more laterally adjoining extrinsic parts (commonly referred to as "extrinsic bases"). The intrinsic base lies directly below the emitter. In a standard symmetrical configuration, there are two extrinsic bases located on opposite sides of the intrinsic base. Each extrinsic base includes a heavily doped contact zone which extends to the upper semiconductor surface and to which electrical contact is made at a location spaced laterally apart from the emitter. Each extrinsic base may include a connection (or link) zone that provides a low-resistance electrical path between the intrinsic base and the associated base contact zone.

The collector contains a buried main portion situated below the intrinsic base so that the emitter-collector current flows generally in the vertical direction. The main collector portion extends laterally beyond the intrinsic base to a heavily doped collector contact zone which typically extends to the upper semiconductor surface to provide electrical access to the collector at a location spaced laterally apart from the emitter and the two base contact zones. Overlying ohmic electrical contacts to the emitter and contact zones complete the transistor.

Referring to the drawings, FIG. 1 illustrates a prior art oxide-isolated npn transistor of the vertical type as described in De Jong et al, U.S. Pat. No. 5,006,476. The semiconductor body in FIG. 1 consists of p- monocrystalline silicon substrate 10 and overlying n- epitaxial silicon layer 12. Recessed field-oxide region 14 divides the epitaxial silicon into a group of laterally separated active semiconductor regions, two of which are interconnected by n+ buried layer 16 situated along the metallurgical interface between substrate 10 and epitaxial layer 12.

In the device of FIG. 1, n+ emitter 18, which is formed by dopant outdiffusion from n+ polycrystalline silicon ("polysilicon") emitter contact 20 so as to be self-aligned to emitter contact 20, overlies p intrinsic base 22. The transistor has two extrinsic bases, each formed with a p+ contact zone 24 and a p connection zone 26. N+ collector contact zone 28 connects to a main collector portion consisting of n+ buried layer 16 and overlying n-type epitaxial portions 30 and 32. Metal silicide caps 34, 36, and 38 respectively overlie contact zones 20, 24, and 28. Oxide spacers 40 provide spacing between emitter contact 20 and each metal silicide cap 36 through which a metal line (not shown) is connected to underlying base contact zone 24.

Numerous engineering trade-offs are made in designing vertical bipolar transistors. For example, by incorporating spacers 40 into the npn transistor of FIG. 1, the probability of an electrical short between emitter contact 20 and either of the base contacts is typically quite low. Base connection zones 26 accompany spacers 40 in order to provide low-resistance links between intrinsic base 22 and each base contact zone 24. However, forming connection zones 26 typically entails additional processing and thus additional manufacturing expense.

As the lateral dimensions of transistors shrink, the probability that heavily doped base contact zones 24 will encroach on emitter 22 increases. Tang et al, "Design Considerations of High Performance Narrow-Emitter Bipolar Transistors," *IEEE Elect. Dev. Lett.*, April 1987, pp. 174–175, and Lu, "Lateral Encroachment of Extrinsic-Base Dopant in Submicrometer Bipolar Transistors," *IEEE Elect Dev. Lett.*, October 1987, pp. 496–498 both investigate the effect of such encroachment in vertical bipolar transistors similar to that of FIG. 1. Tang et al reports decreases in the transistor cutoff frequency $f_T$ and the small-signal transistor current gain. Cutoff frequency $f_T$ is the frequency at which the small-signal current gain drops to 1. Lu et al reports a decrease in the collector current $I_c$.

An important parameter in bipolar transistor design is the punch-through voltage $V_p$. This is the value of the collector-to-emitter voltage $V_{CE}$ at which the depletion region of the collector-base junction reaches the depletion region of the emitter-base junction when the base is open or when the base-to-emitter voltage $V_{BE}$ is at a selected value.

FIGS. 2a, 2b, 3a, and 3b are helpful in understanding the punch-through phenomenon. FIG. 2a illustrates a simplified one-dimensional version of an npn transistor during normal transistor operation, where $t_E$ and $t_B$ respectively are the emitter and base thicknesses. FIG. 3a illustrates the transistor when it is in the punch-through condition. FIGS. 2b and 3b respectively depict the potentials across the transistor when it is in the conditions of FIGS. 2a and 3a.

During normal operation, electrons in the emitter must overcome the potential barrier at the emitter-base junction in order to enter the quasi-neutral region of the base between the two depletion regions. Electrons then diffuse across the quasi-neutral region until they reach the collector-base depletion region where the electric field pulls them into the collector. See FIGS. 2a and 2b. Altogether, the current flow from emitter to collector is barrier limited and diffusion limited. The magnitude of collector-to-emitter voltage $V_{CE}$ does not substantially impact the magnitude of the emitter-to-collector current during normal operation because (a) the potential barrier at the emitter-base junction is controlled by the base-to-emitter voltage $V_{BE}$ and (b) the diffusion-limiting action on the emitter-to-collector current flow is determined by the thickness of the quasi-neutral region of the base.

When collector-to-emitter voltage $V_{CE}$ is raised to such a value that the collector-base depletion region punches through to the emitter-base depletion region, the quasi-neutral region of the base is eliminated as shown in FIGS. 3a and 3b. The diffusion limitation on the emitter-to-collector current flow is no longer present. Also, voltage $V_{CE}$ now directly influences the emitter-base barrier potential, causing its magnitude to be easily reduced. The net result is that the number of electrons passing through the base increases rapidly in a generally undesirable manner as voltage $V_{CE}$ is increased. Accordingly, it is desirable that the magnitude of punch-through voltage $V_P$ be high.

Another important bipolar design parameter is the Early voltage $V_A$. At a given value of base-emitter voltage $V_{BE}$, collector current $I_C$ is ideally independent of collector-to-emitter voltage $V_{CE}$ across the normal $V_{CE}$ operating range. However, because the size of the quasi-neutral region of the base decreases with increasing $V_{CE}$, $I_C$ actually increases slowly with increasing $V_{CE}$ at fixed $V_{BE}$ in the manner generally shown in FIG. 4.

Early voltage $V_A$ is a transistor modeling parameter that constitutes the voltage at which the collector current asymptotes approximately intersect the $V_{CE}$ axis. The points at which the $I_C$ asymptotes at various $V_{BE}$ values intersect the $V_{CE}$ axis do not exactly coincide in a real bipolar transistor. Nonetheless, it has turned out to be a good modeling parameter to consider the $I_C$ asymptotes as all meeting at the $V_A$ position on the $V_{CE}$ axis. As with punch-through voltage $V_P$, it is desirable that the magnitude of the Early voltage $V_A$ be high, ideally infinite.

A critical engineering trade-off relating to the intrinsic base involves punch-through voltage $V_P$, Early voltage $V_A$, and the base (series) resistance $r_B$, on one hand, and cutoff frequency $f_T$ and collector current $I_c$, on the other hand. Reducing base thickness $t_B$ and/or the total base doping causes $f_T$ and $I_C$ to increase. The current gain also increases with reduced $t_B$. However, $V_P$, $V_A$, and $r_B$ are degraded when $t_B$ and/or the base doping is reduced.

In a simplified one-dimensional analysis, this trade-off can be seen from the following equations that apply to a symmetrical single-emitter vertical npn transistor such as that shown in FIG. 1:

$$f_T = \frac{2.43\, \alpha_0\, D_n}{2\pi\, (t_{BEFF})^2} \tag{1}$$

$$I_c = \frac{q\, D_n\, (n_i)^2\, W_E\, L_E}{\displaystyle\int_{t_{BEFF}} N_A(x)\, dx} \exp\left(\frac{q\, V_{BE}}{kT}\right) \tag{2}$$

$$V_A = \frac{q \displaystyle\int_{t_B} N_A(x)\, dx}{C_{jc}} \tag{3}$$

$$r_B = \frac{W_E}{12\, L_E\, q\, \mu_n \displaystyle\int_{t_{BEFF}} N_A(x)\, dx} \tag{4}$$

$$V_P = \frac{q\left(\displaystyle\int_{t_B} N_A(x)\, dx\right)^2}{2\, K_S\, \epsilon_0\, N_D} \tag{5}$$

where:

x is an integrating variable in the base along the direction of main current flow, $\alpha_O$ is the static common-base current gain (nearly 1), $D_n$ is the average electron diffusivity in the base, $t_B$ is the metallurgical thickness of the base—i.e., the distance between the emitter-base and collector-base junctions, $t_{BEFF}$ is the effective electrical thickness of the base—i.e., the distance between the boundaries of the emitter-base and collector-base depletion regions, $n_i$ is the intrinsic electron density (approximately $1.4 \times 10^{10}$ electrons/cm$^3$ in silicon at room temperature), $N_A$ is the base (acceptor) dopant concentration, $W_E$ is the lateral width of the emitter, $L_E$ is the length of the emitter, $C_{jc}$ is the depletion capacitance of the collector-base junction per unit area, $N_D$ is the collector (donor) dopant concentration, assumed to be constant and much smaller than base dopant concentration $N_A$ except in the immediate vicinity of the collector-base junction, $\mu_n$, which equals $D_n q/kT$, is the electron mobility, q is the electronic charge, k is Boltzmann's constant T is the absolute temperature, $\epsilon_O$ is the permittivity of free space, and $K_s$ is the relative permittivity of silicon. Use of $t_{BEFF}$ in the dopant integral (in each) of Eqs. 2 and 4 indicates that this integral is taken across the quasi-neutral region of the intrinsic base—i.e., the region extending between the two depletion regions. The dopant integral in Eqs. 2 and 4 is commonly referred to as the Gummel number. The dopant integral in Eqs. 3 and 5 is taken across the full metallurgical thickness of the base as indicated by the use of $t_B$ in this integral. Eqs. 1–4 are available in prior art semiconductor literature. See: (a) Philips, *Transistor Engineering* (McGraw-Hill; reprinted: Robert E. Krieger Pub. Co., 1981), 1962, pages 298–304; (b) Warner et al, *Transistor Fundamentals for the Integrated-Circuit Engineer* (John Wiley & Sons), 1983, pages 559–562; (c) Muller et al, *Device Electronics for Integrated Circuits* (John Wiley & Sons), 1977, pages 241–245; and (d) Grove, *Physics and Technology of Semiconductor Devices* (John Wiley & Sons), 1967, pages 228–230.

Eq. 5 has been derived here based on the following approximations: (a) the base region is totally depleted by the collector-base voltage at punch-through and (b) the collector-base junction is sufficiently asymmetrical to apply the single-sided abrupt approximation for the calculation of its depletion layer thickness, and to neglect the voltage drop on its heavily doped side. These modeling approximations are considered to be particularly valid in high-frequency transistors.

In particular, equating the depletion layer charges in the base and collector leads to:

$$q \int_{t_B} N_A(x)\, dx = q\, N_D\, x_{dC}(V_P) \tag{6}$$

where $X_{dc}$ is the total depletion thickness on the collector side of the collector-base junction. Assuming that $X_{dC}$ is approximately equal to the total depletion thickness along the collector-base junction according to classical pn-junction theory as provided in Grove (cited above), one has:

$$x_{dC} = \sqrt{\frac{2\, K_S\, \epsilon_O\, V_P}{q\, N_D}} \tag{7}$$

Substituting Eq. 7 into Eq. 6 produces Eq. 5.

If base dopant concentration $N_A$ is reduced, the dopant integral in Eq. 2 decreases along with $t_{BEFF}$ in Eq. 1. Collector current $I_C$ and cutoff frequency $f_T$ thereby increase, as is desirable. However, the dopant integrals in Eqs. 3–5 also decrease. This leads to decreases in punch-through voltage $V_P$ and Early voltage $V_A$ and an increase in base resistance $r_B$, all of which are disadvantageous. It would be desirable to increase the collector current and cutoff frequency without degrading the punch-through voltage, Early voltage, and base resistance.

GENERAL DISCLOSURE OF THE INVENTION

The present invention furnishes a special two-dimensional intrinsic base doping profile that enables the output current-voltage ("I–V") characteristics to be improved in a vertical bipolar transistor. For example, the magnitudes of the punch-through voltage and Early voltage are considerably higher in the transistor of the invention than in an otherwise similar bipolar transistor having the same active-region collector current extrapolated to zero collector-to-emitter voltage as the present transistor but lacking the special two-dimensional intrinsic base doping profile of the invention. Alternatively, the invention enables the collector current to be increased while maintaining the values of the punch-through and Early voltages.

When the magnitude of the punch-through voltage is raised at constant zero-$V_{CE}$ extrapolated active-region collector current in accordance with the invention, the base resistance is typically reduced without decreasing the cutoff frequency. Alternatively, when the invention is employed to raise the collector current at constant punch-through voltage, the cutoff frequency typically increases without degrading the base resistance. In either case, the net result is a substantial improvement in transistor performance.

The intrinsic base of the present transistor includes a main intrinsic portion. The two-dimensional intrinsic base doping profile of the invention is achieved with a pair of more lightly doped base portions that encroach substantially into the intrinsic base below the main intrinsic base portion. The two deep encroaching base portions set up a two-dimensional charge-sharing mechanism. Part of the fixed collector depletion charge which would otherwise couple vertically with the fixed depletion charge in the main intrinsic portion of the base so as to cause punch-through now couples laterally with fixed depletion charge in the two encroaching base portions. For a given nominal base thickness, the magnitude of the punch-through voltage thereby increases.

More particularly, the bipolar transistor of the invention is furnished with an emitter, collector, and intervening multi-component base all situated in a vertical arrangement in a semiconductor body. The emitter extends to the upper surface of the semiconductor body. The main intrinsic portion of the base is located below the emitter and above a main portion of the collector.

As indicated above, the two base portions which encroach into the intrinsic base have lighter doping than the main intrinsic base portion and extend deeper into the semiconductor body than the main intrinsic base portion. The two deep encroaching base portions are laterally separated from each other below the main intrinsic base portion by a minimum spacing $S_{NE}$ which is less than three times the minimum vertical thickness $t_{BMIN}$ of the base. Preferably, $S_{NE}$ is less than twice $t_{BMIN}$. In any case, the two encroaching base portions extend sufficiently close to each other to set up the above-mentioned charge sharing and thereby improve the output I–V characteristics.

Inasmuch as the two deep encroaching base portions are more lightly doped than the main intrinsic base portion, the upper boundary of the portion of the collector-base depletion region below the emitter extends to substantially the same vertical position in the intrinsic base of the present transistor as in the intrinsic base of a bipolar transistor that lacks the two deep encroaching base portions but is otherwise the same as the transistor of the invention. Thus, the presence of the two deep encroaching base portions does not significantly change the effective electrical thickness of the base. Accordingly, the cutoff frequency of the present transistor is substantially the same as that of an otherwise equivalent bipolar transistor that lacks the deep encroaching base portions.

The two deep encroaching base portions can be arranged in various configurations with respect to the emitter. When, as viewed in a direction perpendicular to the upper semiconductor surface, the emitter is in the shape of a stripe, the two nearest opposing edges of the deep encroaching base portions typically extend along the length of the stripe. Alternatively, the two nearest opposing edges of the deep encroaching base portions can cross the stripe, typically at a right angle. The transistor can also be furnished with one or more additional emitters and one or more additional encroaching base portions.

In fabricating the transistor of the invention, the following steps are performed on a surface-adjoining major region of a first conductivity type in a semiconductor body. Dopant of a second conductivity type opposite to the first conductivity type is introduced into the major region through its upper surface to define a first base layer of the second conductivity type. Dopant of the first conductivity type is introduced into the major region through a segment of its upper surface to define the emitter as a region of the first conductivity type overlying a main intrinsic portion of the first base layer. Further dopant of the second conductivity type is introduced into the major region through laterally separated segments of its upper surface. During this step, part of the further dopant is driven sideways and downwards to form the two deep encroaching base portions as regions of the second conductivity type.

The three dopant-introduction steps can be initiated in various orders. Typically, these three steps are performed at least partially in parallel.

In one embodiment of the present method, the step of introducing the further dopant to form the two deep encroaching base portions is initiated after initiating the other two dopant-introduction steps. In this case, the further dopant is typically implemented with a semiconductor impurity which diffuses through the major region at a faster rate than the dopants used in the other two dopant-introduction steps. When the first and second conductivity types respectively are n-type and p-type, aluminum is preferably utilized as the fast-diffusing impurity. Consequently, the locations of the encroaching base portions can be established without significantly affecting the locations of the emitter and the main intrinsic base portion. During the driving of the further dopant, spacers provided along an emitter contact are typically used to control the locations of the encroaching base portions.

Alternatively, the step of introducing the further dopant can be initiated before initiating the emitter dopant-introduction step.

BRIEF DESCRIPTION OF THE DRAWINGS

FIGS. 2a and 3a are simplified one-dimensional diagrams of a bipolar transistor respectively in normal operation and in a punch-through condition, FIGS. 2b and 3b are graphs for potential as a function of distance for the simplified transistor of FIGS. 2a and 3a respectively during normal operation and punch-through.

FIG. 4 is a graph of collector current as a function of collector-to-emitter voltage for indicating the Early voltage.

FIGS. 25 and 26 are three-dimensional graphs of the electric field surface respectively for the encroached-base transistor of FIG. 10 and the simulated baseline transistor.

FIG. 31 is a cross-sectional front view through plane 31—31 in FIG. 30.

FIG. 34 is a cross-sectional side view through plane 34—34 in FIGS. 33 and 35.

Figure 1:
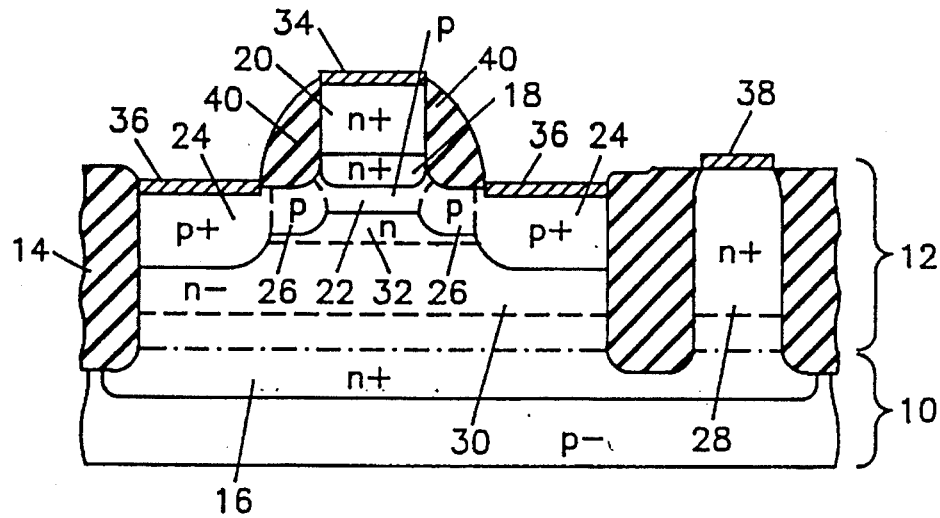
FIG. 1 is a cross-sectional front view of a conventional vertical bipolar transistor.

Dashed lines generally indicate boundaries between regions of the same conductivity type but of substantially different dopant concentration. In the drawings containing depletion regions, dotted lines generally indicate the locations of the depletion regions. The metallurgical interface between substrate and epitaxial layer is indicated by dot-and-dash lines in the drawings.

Like reference symbols are employed in the drawings and in the description of the preferred embodiments to represent the same or very similar item or items.

DESCRIPTION OF THE PREFERRED EMBODIMENTS

FIGS. 5–8 illustrate a narrow-emitter vertical npn transistor structure configured according to the teachings of the invention so as to improve the output I–V characteristics. In particular, the magnitudes of punch-through voltage $V_P$ and Early voltage $V_A$ are both greater in the transistor of FIGS. 5–8 than in an otherwise identical bipolar transistor that has either the same extrapolated active-region collector current at zero collector-to-emitter voltage or the same minimum base thickness but lacks the enhancements of the invention. Also, the base resistance $r_B$ is typically reduced in the transistor of FIGS. 5–8 without impairing the transistor cutoff frequency $f_T$.

Figure 5:
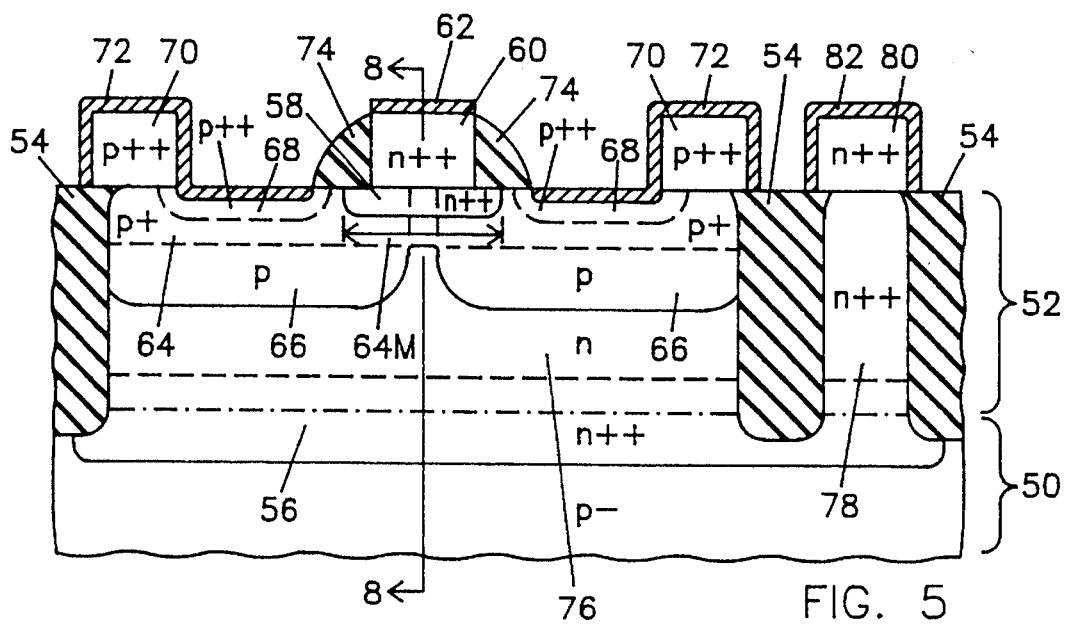
FIG. 5 is a cross-sectional front view of a vertical bipolar transistor that contains a pair of deep encroaching base portions in accordance with the invention.
Figure 6:
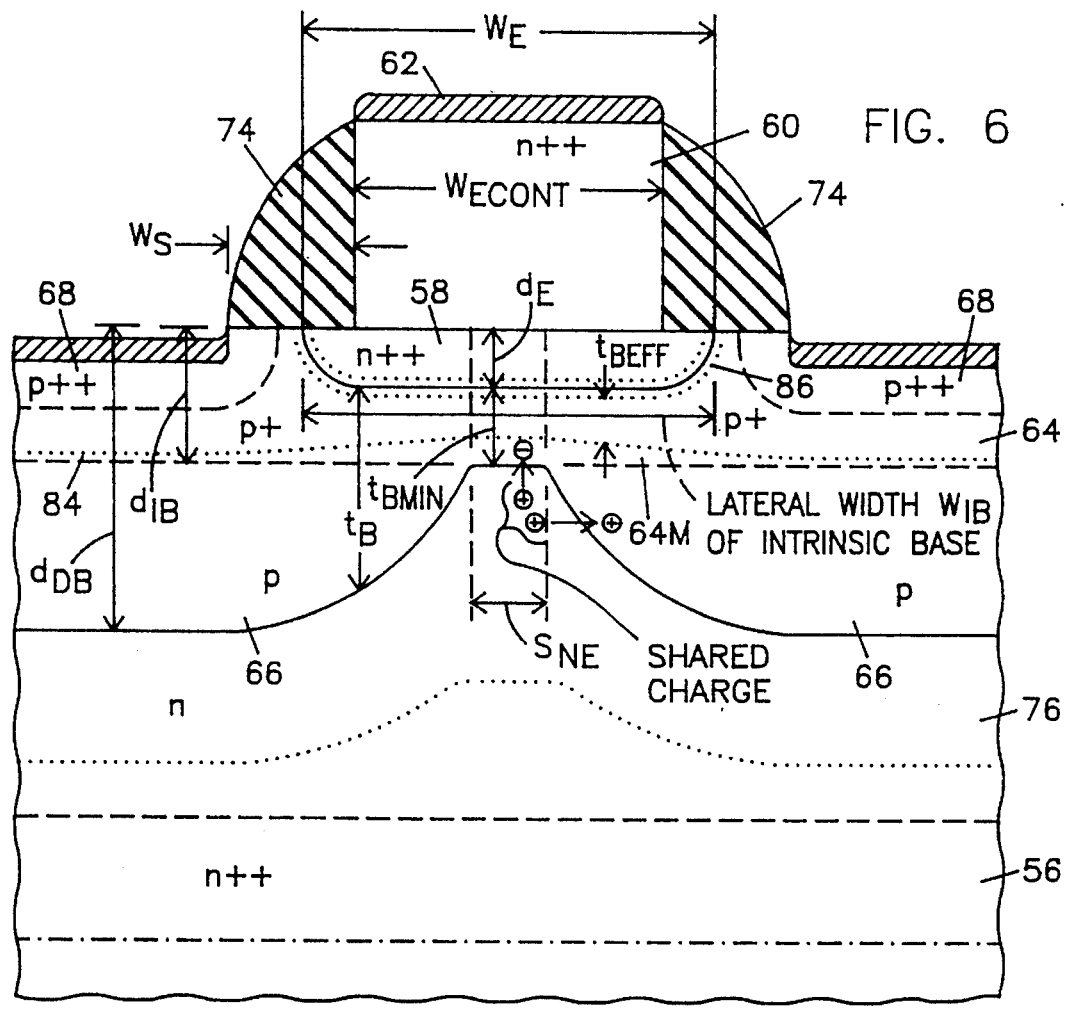
FIG. 6 issue three-fold magnification of a portion of FIG. 5 generally centering around the main intrinsic base portion.
Figure 7:
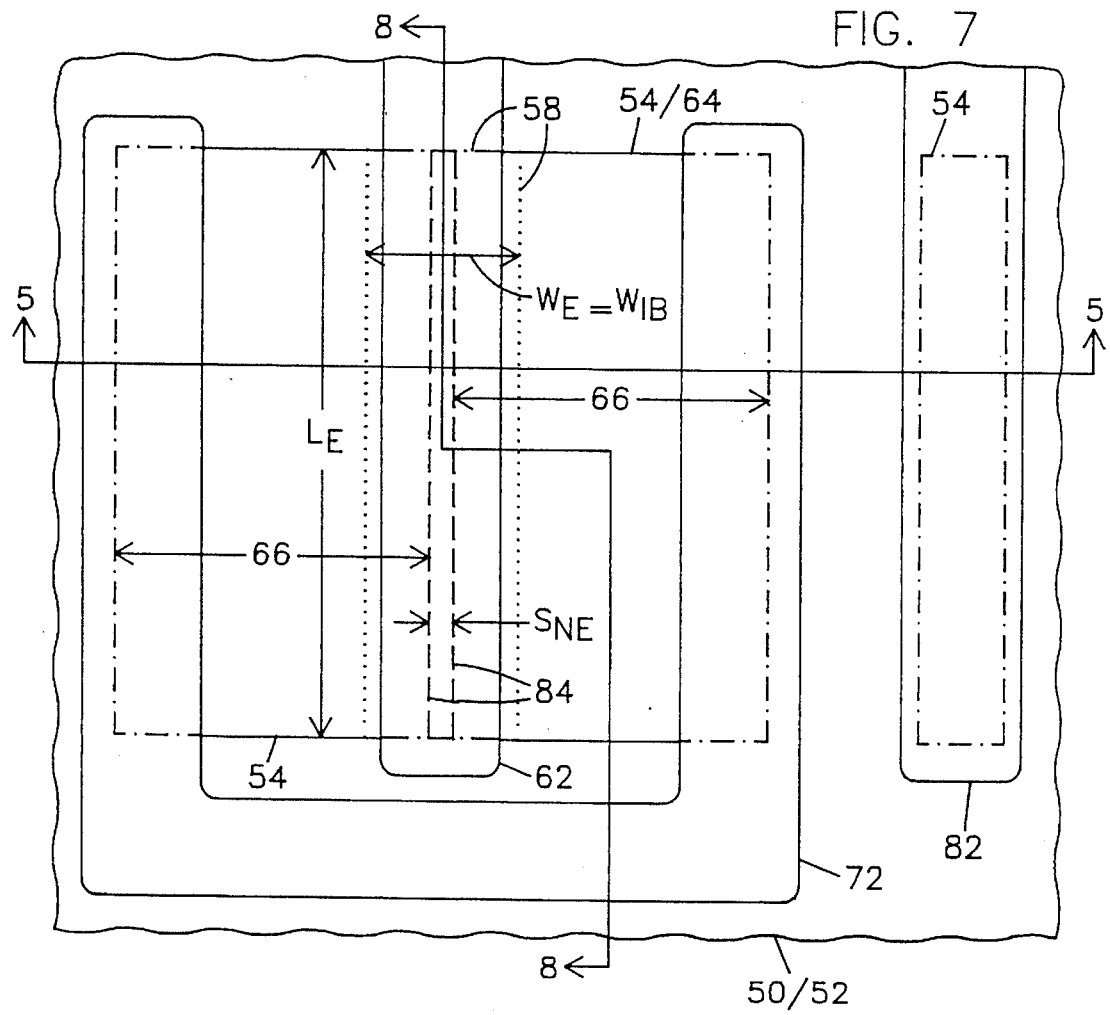
FIG. 7 is a layout view for the transistor of FIG. 5. The cross section of FIG. 5 is taken through plane 5—5 in FIG. 7.
Figure 8:
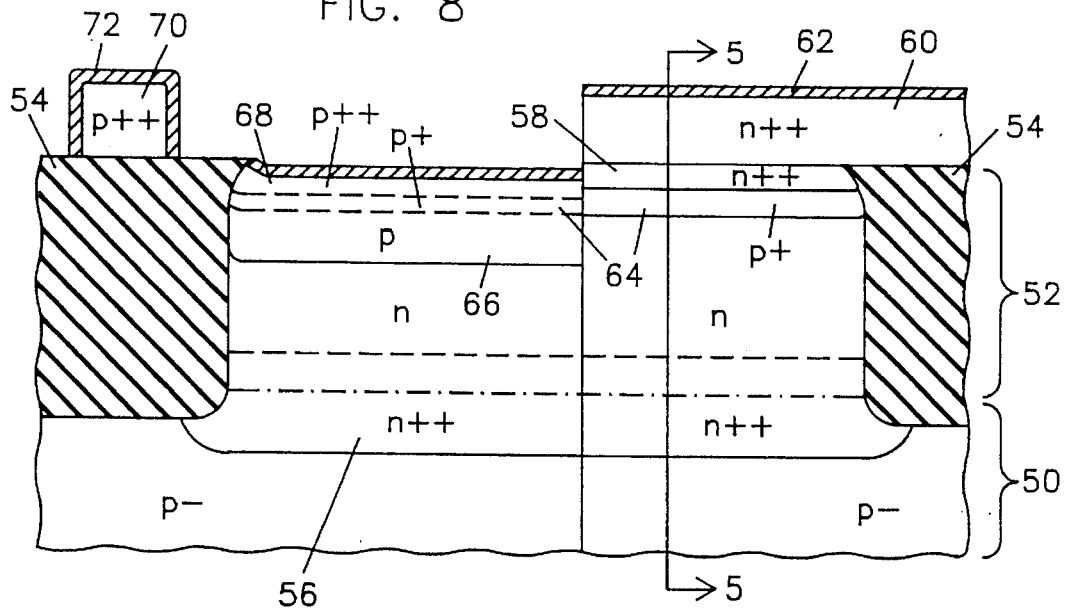
FIG. 8 is a stepped cross-sectional side view for the transistor of FIG. 5. The cross section of FIG. 8 is taken through stepped plane 8—8 in FIGS. 5 and 7. The cross section of FIG. 5 is further taken through plane 5—5 in FIG. 8.

The cross-sectional views of FIGS. 5 and 8 are taken through planes 5—5 and 8—8 in the transistor layout view of FIG. 7. FIG. 6 is a magnification of the portion of FIG. 5 centered generally around the intrinsic base.

The transistor of FIGS. 5–8 has an emitter, collector, and intervening base. These elements are created from a semiconductor body consisting of a (100) lightly doped p-type monocrystalline silicon semiconductor substrate 50 and an overlying moderately doped n-type epitaxial silicon layer 52. P- substrate 50 has an average net dopant concentration of $2\times10^{14}$–$6\times10^{14}$ atoms/cm$^3$, typically $4\times10^{14}$ atoms/cm$^3$. N epitaxial layer 52 has an average net dopant concentration of $1\times10^{16}$–$4\times10^{16}$ atoms/cm$^3$, typically $2\times10^{16}$ atoms/cm$^3$. The thickness of epitaxial layer 52 is 0.9–1.2 μm, typically 1.0 μm.

A patterned electrically insulating field region 54 of silicon oxide is recessed into the semiconductor body along the upper surface of n epitaxial layer 52. Field-oxide region 54 typically extends fully through epitaxial layer 52 and slightly into p- substrate 50 so as to divide layer 52 into a group of laterally separated active semiconductor device regions. Two such active device regions are shown in FIG. 5. The lateral dimension of the portion of field oxide 54 lying between these two device regions is not drawn to scale in FIG. 5.

A very heavily doped buried n-type layer 56 situated along the metallurgical interface between substrate 50 and layer 52 electrically interconnects the two active device regions shown in FIG. 5. Buried n++ layer 56 has a maximum net dopant concentration of $2 \times 10^{19}$–$8 \times 10^{19}$ atoms/cm$^3$, typically $4 \times 10^{19}$ atoms/cm$^3$.

Figure 2A:
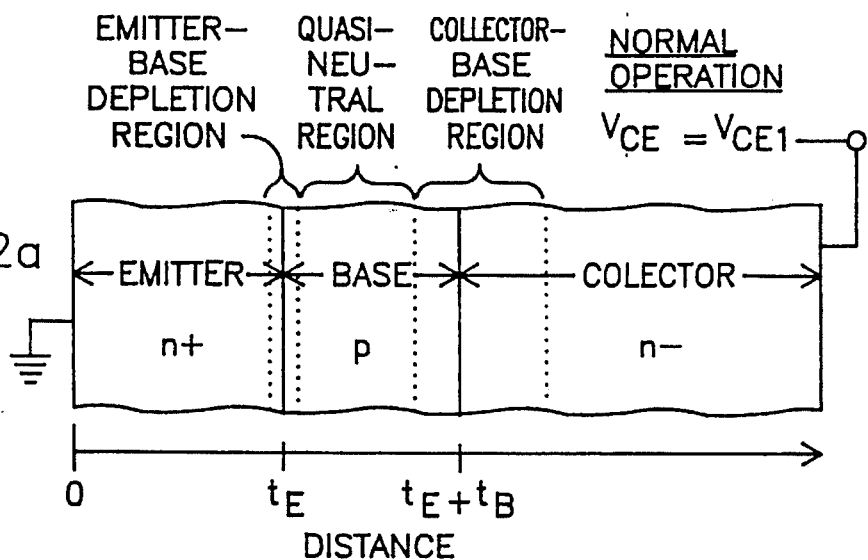

The transistor's emitter is a very heavily doped n-type zone 58 situated in the left-hand active region along the upper surface of the semiconductor body. N++ emitter 58 reaches a maximum net dopant concentration of $1 \times 10^{20}$–$4 \times 10^{20}$ atoms/cm$^3$, typically $2.5 \times 10^{20}$ atoms/cm$^3$ at the upper semiconductor surface Emitter 58 extends to a depth $d_E$ of 0.09–0.11 µm, typically 0.10 µm, into epitaxial layer 52. Emitter depth $d_E$ is also the emitter thickness (corresponding to emitter thickness $t_E$ in the one-dimensional representation of FIG. 2a). The lateral width $W_E$ of emitter 58 is 0.5–0.7 µm, typically 0.6 µm.

An overlying very heavily doped n-type polysilicon emitter contact 60 coated with a thin metal silicide cap 62 contacts emitter 58 in a self-aligned manner. Polysilicon emitter contact 60 has a lateral width $W_{ECONT}$ of 0.45–0.55 µm, typically 0.5 µm.

The base of the transistor consists of a heavily doped p-type intrinsic base layer 64, a pair of moderately doped deep p-type encroaching base portions 66, and a pair of very heavily doped p-type extrinsic base contact zones 68 respectively corresponding to encroaching base portions 66. Components 64–68 are divided into an intrinsic base and a pair of extrinsic bases located symmetrically on opposite sides of the intrinsic base.

The intrinsic part of the base lies directly below n++ emitter 58 so that the lateral width $W_{IB}$ of the intrinsic base is the same as emitter width $W_E$. Portions of components 64 and 66 form the intrinsic base. P+ base layer 64 extends fully across the left-hand active semiconductor region in FIG. 5 and reaches a maximum net dopant concentration of $2 \times 10^{18}$–$8 \times 10^{18}$ atoms/cm$^3$, typically $5 \times 10^{18}$ atoms/cm$^3$, at the upper semiconductor surface. Layer 64 extends to a depth $d_{IB}$ of 0.18–0.24 µm, typically 0.20 µm, into n epitaxial layer 52.

Figure 9:
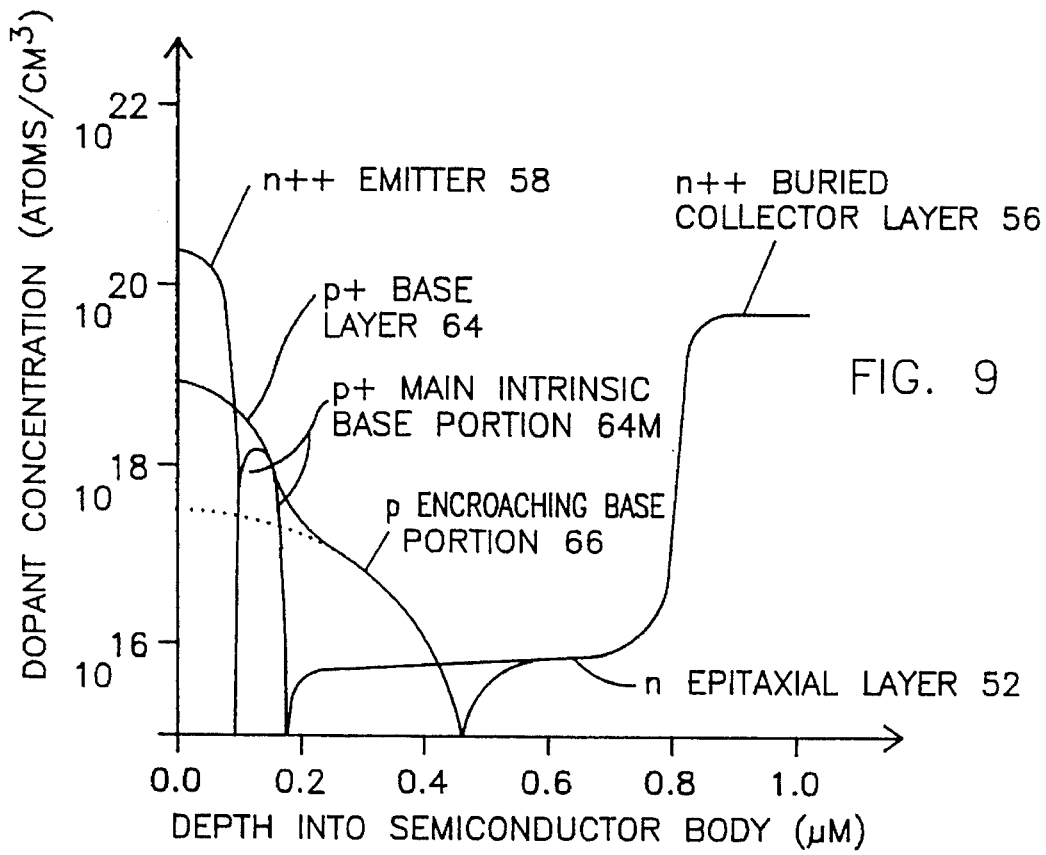
FIG. 9 is a graph of dopant concentration as a function of depth for an implementation of the transistor of FIG. 5.

P base portions 66 extend deeper into n epitaxial layer 52 than p+ base layer 64 and have a lighter doping concentration than p layer 64. In particular, p portions 66 reach a maximum net dopant concentration of $1 \times 10^{17}$–$4 \times 10^{17}$ atoms/cm$^3$, typically, $2 \times 10^{17}$ atoms/cm$^3$, along the bottom of layer 64 outside the intrinsic base. Each portion 66 extends to a depth $d_{DB}$ of 0.4–0.6 µm, typically 0.45 µm, into epitaxial layer 12 outside the intrinsic base. FIG. 9 illustrates a typical doping profile for the transistor of FIG. 5 except for p++ base contact zones 68.

A main portion 64M of p+ base layer 64 directly underlies n++ emitter 58 and constitutes part of the intrinsic base. Each deep p portion 66 encroaches substantially into the semiconductor material directly below p+ main intrinsic base portion 64M to form an additional part of the intrinsic base. The minimum thickness of the intrinsic base occurs at a location between encroaching base portions 66 and is also the minimum thickness $t_{BMIN}$ of main intrinsic base portion 64M. Inasmuch as $t_{BMIN}$ equals $d_{IB}$–$d_E$, $t_{BMIN}$ equals 0.08–0.12 µm, typically 0.10 µm.

Deep encroaching base portions 66 extend sufficiently close to each other below main intrinsic base portion 64M, without touching one another along their nearest side edges 66E (see FIG. 7), that the electric field in the transistor structure is shaped in such a way as to increase the magnitude of punch-through voltage $V_P$ beyond what would exist if encroaching portions 66 were absent. An increase of more than 20% in the magnitude of voltage $V_P$ is typically achievable in the encroached-base transistor of FIG. 5. This is a clear improvement.

To achieve such punch-through voltage improvement, the minimum spacing $S_{NE}$ between encroaching base portions 66 is less than three times, usually less than two times, $t_{BMIN}$. Preferably, $S_{NE}$ is less than $1.5 t_{BMIN}$. $S_{NE}$ is typically in the vicinity of 0.1 µm when emitter width $W_E$ and the base doping have values in the vicinity of those given above for the transistor of FIG. 5. The precise value of spacing $S_{NE}$ is critically determined by simulation and experimentation so as to obtain a desired increase in the $V_P$ magnitude.

Each extrinsic base consists of one of p++ base contact zones 68, the adjoining part of p+ intrinsic base layer 64 outside main intrinsic base portion 64M, and the underlying part of p encroaching base portion 66. In addition to performing the field-shaping function that improves the $V_P$ characteristics, encroaching base portions 66 serve as connection zones that help provide low-resistance paths from the intrinsic base to base contact zones 68 in the extrinsic bases.

Contact zones 68 reach a maximum net dopant concentration of $1 \times 10^{19}$–$5 \times 10^{19}$ atoms/cm$^3$, typically $2 \times 10^{19}$ atoms/cm$^3$, at the upper semiconductor surface. Although FIG. 5 indicates that contact zones 68 do not extend as deep into n epitaxial layer 52 as intrinsic base layer 64, zones 68 could extend deeper into epitaxial layer 52 than layer 64. However, encroachment of heavily doped contact zones 68 into the intrinsic base needs to be avoided.

Each base contact zone 68 contacts an overlying very heavily doped p-type polysilicon base contact 70. In the illustrated example, parts of p+ base layer 64 situated in the extrinsic bases also make contact with base contact 70. A thin metal silicide cap 72 extends from contact zone 68 to base contact 70 to reduce the base resistance. As shown in FIGS. 7 and 8, base contact 70 and cap 72 are in the shape of a "U" that extends from one of the extrinsic bases to the other.

A pair of electrically insulating spacers 74 consisting of silicon oxide are situated along the sidewalls of emitter contact 60. Oxide spacers 74 laterally separate metal silicide cap 72 from emitter contact 60 and metal silicide cap 62 so as to avoid short circuiting the base to emitter 58. During transistor fabrication, spacers 74 are typically utilized to control the lateral separation between emitter 58 and each base contact zone 68. As described below, spacers 74 are also employed to control spacing $S_{NE}$ during the formation of encroaching base portions 66. Each spacer 74 typically has a bottom width $W_S$ (taken in the same direction as emitter width $W_E$) of 0.1–0.2 µm, typically 0.15 µm.

The transistor's collector includes a main collector region formed with n++ buried layer 56 and an overlying moderately doped n-type epitaxial portion 76 that typically extends up to main intrinsic base portion 64M and encroaching base portions 66 in the left-hand active semiconductor region in FIG. 5. The collector also includes a very heavily doped n-type collector contact region 78 that provides the main collector region with an electrical path to the upper semiconductor surface through the right-hand active semiconductor region in FIG. 5. An overlying very heavily doped n-type polysilicon collector contact 80 coated with a thin metal silicide cap 82 contacts n++ collector contact 78 to complete the transistor structure.

The improvement in punch-through voltage $V_P$ occurs for the following reasons. Punch-through in a vertical bipolar transistor having symmetrically located extrinsic bases normally occurs along the center plane of the intrinsic base where the depletion region of the collector-base junction first touches the depletion region of the emitter-base junction when collector-to-emitter voltage $V_{CE}$ is high enough. In the transistor of FIG. 5 where the emitter is narrow and the intrinsic base is substantially encroached by deep p base portions 66, a portion of the fixed positive depletion charge in the center of the collector part of the depletion region along the collector-base junction is shared with (a) fixed negative depletion charge in the main intrinsic part of the depletion region along the collector-base junction (vertical charge coupling) and with (b) fixed negative depletion charge in the encroaching base part of the depletion region along the collector-base junction (lateral charge coupling). FIG. 6 illustrates the charge sharing.

Due to the charge sharing, only part of the collector depletion charge enters the charge balance relationship that determine punch-through voltage $V_P$. Accordingly, Eq. 6 above is changed to:

$$q \int_{t_B} N_A(x) \, dx = \alpha \, q \, N_D \, x_{dC} (V_P) \tag{8}$$

where $\alpha$, which is less than 1, is a charge-sharing coefficient. Eq. 5 therefore changes to:

$$V_P = \frac{q \left( \int_{t_B} N_A(x) \, dx \right)^2}{2 \alpha^2 \, K_S \, \epsilon_0 \, N_D} \tag{9}$$

Inasmuch as $\alpha$ is less than 1, the strong encroachment of p regions 66 into the intrinsic base increases voltage $V_P$ over the value that would otherwise occur if p regions 66 were absent (i.e., did not encroach). In physical terms, it takes more voltage on the collector-base junction to create, by depletion, the positive charge necessary to balance the negative charge corresponding to the punch-through condition in the central portion of the fully depleted base.

The distance from the bottom of emitter 58 to the underlying point along the collector-base junction is the (vertical) base thickness $t_B$. As shown in FIG. 6, the presence of deep encroaching base portion 66 causes metallurgical base thickness $t_B$ to vary greatly across the intrinsic base.

The dotted lines in FIG. 6 indicate the approximate boundaries of the depletion regions of the collector-base and emitter-base junctions. In particular, dotted line 84 represents the approximate boundary of the base portion of the depletion region of the collector-base junction. Dotted line 86 similarly represents the approximate boundary of the base portion of the depletion region of the emitter-base junction. The region between depletion boundaries 84 and 86 is thus the quasi-neutral portion of the intrinsic base. The distance between boundaries 84 and 86 is the effective thickness $t_{BEFF}$ of the quasi-neutral base region.

Inasmuch as deep encroaching base portions 66 are more lightly doped than base layer 64, depletion boundary 84 is situated in base layer 64 relatively close to the bottom of layer 64. Accordingly, effective base thickness $t_{BEFF}$ is substantially constant across the intrinsic base even though actual base thickness $t_B$ varies greatly across the intrinsic base. Importantly, the portion of depletion boundary 84 located below emitter 58 extends to substantially the same vertical position that would arise if encroaching base portions 66 were absent. With reference to Eq. 1, cutoff frequency $f_T$ is thus of substantially the same value that would arise in a vertical bipolar transistor lacking encroaching base portions 66 but otherwise identical to the encroached-base transistor of FIGS. 5–8.

Instead of utilizing the charge-sharing mechanism to increase punch-through voltage $V_P$, the dimensional/doping parameters of the transistor can be modified to reduce minimum base width $t_{BMIN}$. Collector current $I_C$ and cutoff frequency $f_T$ can then be increased while voltage $V_P$ is maintained constant. Alternatively, the transistor's dimensional/doping parameters can be adjusted to provide intermediate improvements in voltage $V_P$ and current $I_C$. Like comments apply to the Early voltage $V_A$. In these ways, the invention improves the output I–V characteristics of a vertical bipolar transistor having an intrinsic base situated between a pair of extrinsic bases.

Computer simulations have been done to analyze the effect of the charge sharing in a vertical bipolar transistor having its intrinsic base substantially encroached in the manner described above. The simulations were performed with the Medici two-dimensional semiconductor device simulation program available from Technology Modeling Associates. The simulated transistors were described on a dense 3500-node grid using half-device representation with reflective boundary conditions on both sides of the representation.

Figure 10:
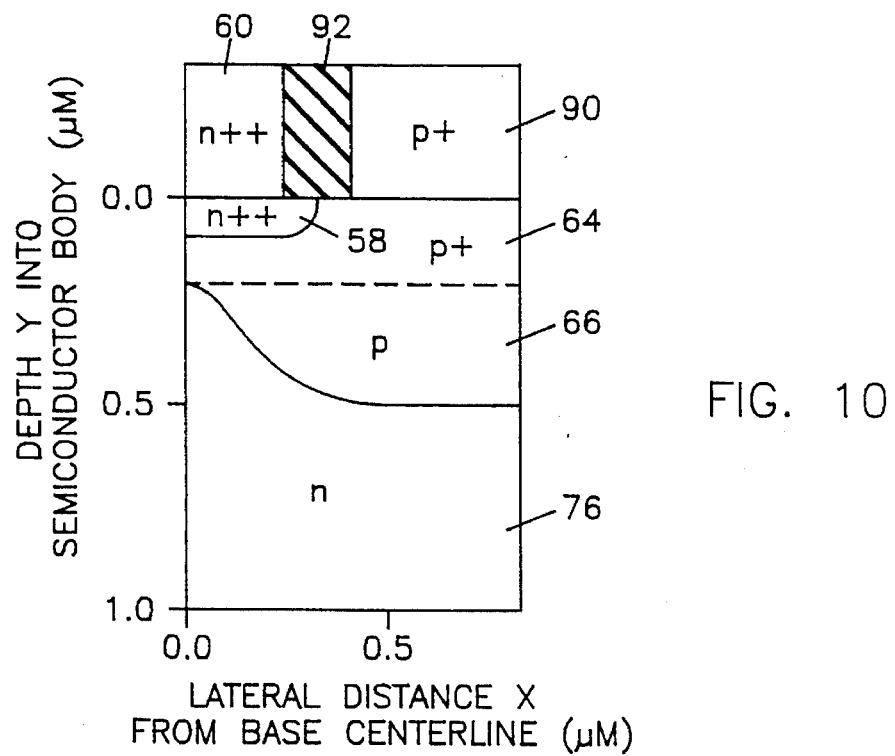
FIG. 10 is a cross-sectional front view of a simplified vertical bipolar transistor provided with a pair of deep encroaching base, portions in accordance with the invention for use in computer simulation.

FIG. 10 illustrates the profile of an encroached-base npn transistor structure employed in the computer simulations. The left-hand axis in FIG. 10 extends along the centerline of the emitter and base. To simplify the analysis, the p++ base contact zones were omitted in the simulations, and the base contacts were forced to be ohmic. The collector contact was assumed to be located at the bottom of the structure along the emitter-base centerline. Also, the upper semiconductor surface was assumed to be substantially flat. Items 90 and 92 in FIG. 10 respectively indicate the polysilicon base contact and a simplified version of spacer 74.

For the computer simulations, it was assumed that the dopings for emitter 58 and intrinsic base layer 64 were initiated before the doping for deep encroaching base portions 66. It was also assumed that the two-dimensional dopant concentration profile of encroaching base portions 66 resulted from diffusing a fast-diffusing p-type dopant, such as aluminum, into the semiconductor body from a dopant source situated next to spacer 92. Accordingly, deep encroaching base portion 66 in FIG. 10 was self-aligned to the outside edge of spacer 92, and was formed without significantly affecting the dopant profiles for shallow emitter 58 and intrinsic base layer 64.

The depth of lateral diffusion was assumed to be approximately 80% of the depth of vertical diffusion for both n-type and p-type dopants. Spacing $S_{NE}$ was thus given approximately as:

$$S_{NE} = W_E + 2W_S - 2(0.8 d_{DB}) \tag{10}$$

In a similar manner, polysilicon emitter contact 60 was assumed to constitute a dopant source for emitter 58 so that emitter contact 60 was self-aligned to the emitter 58.

The following numerical values were used in the simulations:

n-type emitter dopant concentration at upper surface=$2.5 \times 10^{20}$ atoms/cm$^3$, p-type dopant concentration of intrinsic base layer 64 at upper surface=$5.0 \times 10^{18}$ atoms/cm$^3$, upper-surface concentration of p-type dopant that produces encroaching base portions 66=$2.0 \times 10^{17}$ atoms/cm$^3$, n-type dopant concentration of epitaxial layer 76 and lightly doped portion of collector=$2.0 \times 10^{16}$ atoms/cm$^3$, emitter depth $d_E$=0.10 μm, depth $d_{IB}$ of intrinsic base layer 64=0.20 μm, whereby minimum vertical base thickness $t_{BMIN}$=0.10 μm, depth $d_{DB}$ of encroaching base portions 66=0.50 μm, epitaxial thickness=1.0 μm with standard gradual transition to n++ buried layer, width $W_{ECONT}$ of emitter contact 60=0.50 μm, emitter width $W_E$=intrinsic base portion width $W_{IB}$=0.66 μm (as a result of 0.8 lateral-to-vertical diffusion ratio), spacer width $W_S$=0.16 μm, width $W_{ECONT}$ of base contact 90=0.39 μm, lateral width of base (total)=1.60 μm, recombination-generation lifetime at low doping concentration in monocrystalline silicon for both electrons and holes=0.1 μsec, recombination-generation lifetime at low doping concentration in polysilicon for both electrons and holes=0.01 μsec, modeling parameter $N_{SRHN}$ in the concentration-dependent recombination law=$4 \times 10^{17}$ atoms/cm$^3$, Auger recombination parameters AUGN and AUGP=$2 \times 10^{-31}$ recombinations/cm$^3$-sec, band gap narrowing parameter NO.BGN=$1 \times 10^{18}$ atoms/cm$^3$, and contact resistance at base silicide contact=40 ohm-μm$^2$.

All other material properties were set at their default Medici values.

Figure 11A:
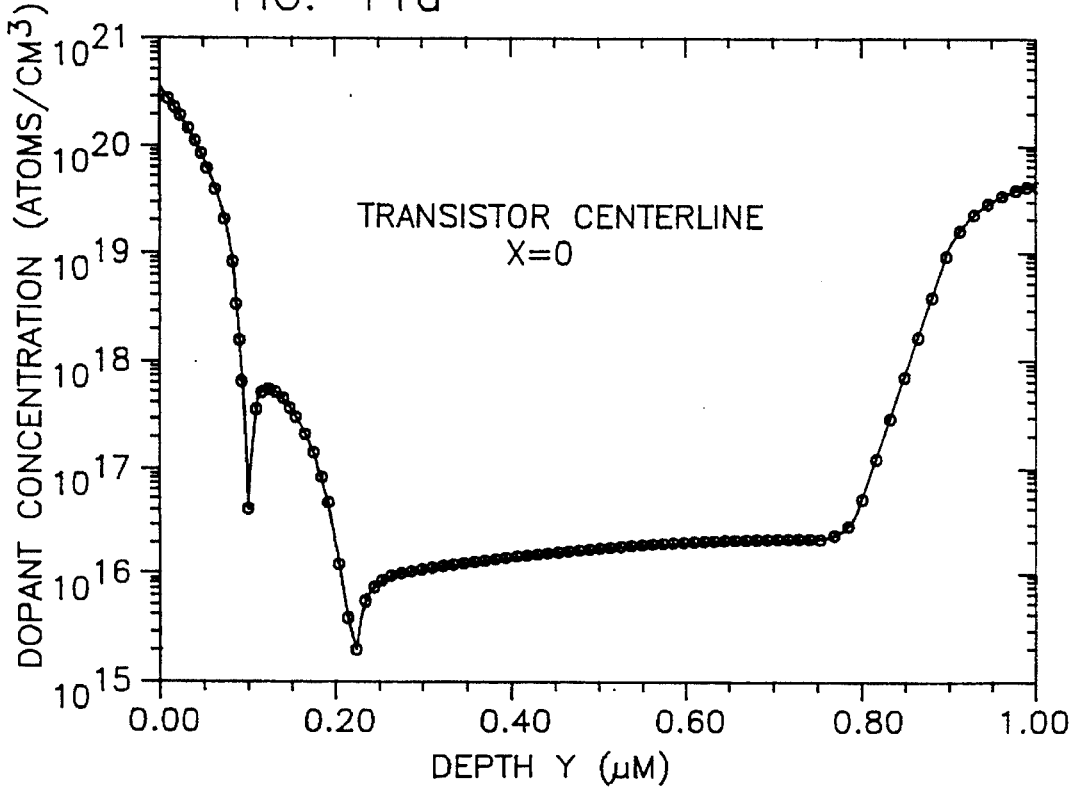
FIGS. 11a and 11b are graphs for dopant concentration as a function of depth for the encroached-base transistor of FIG. 10.
Figure 11B:
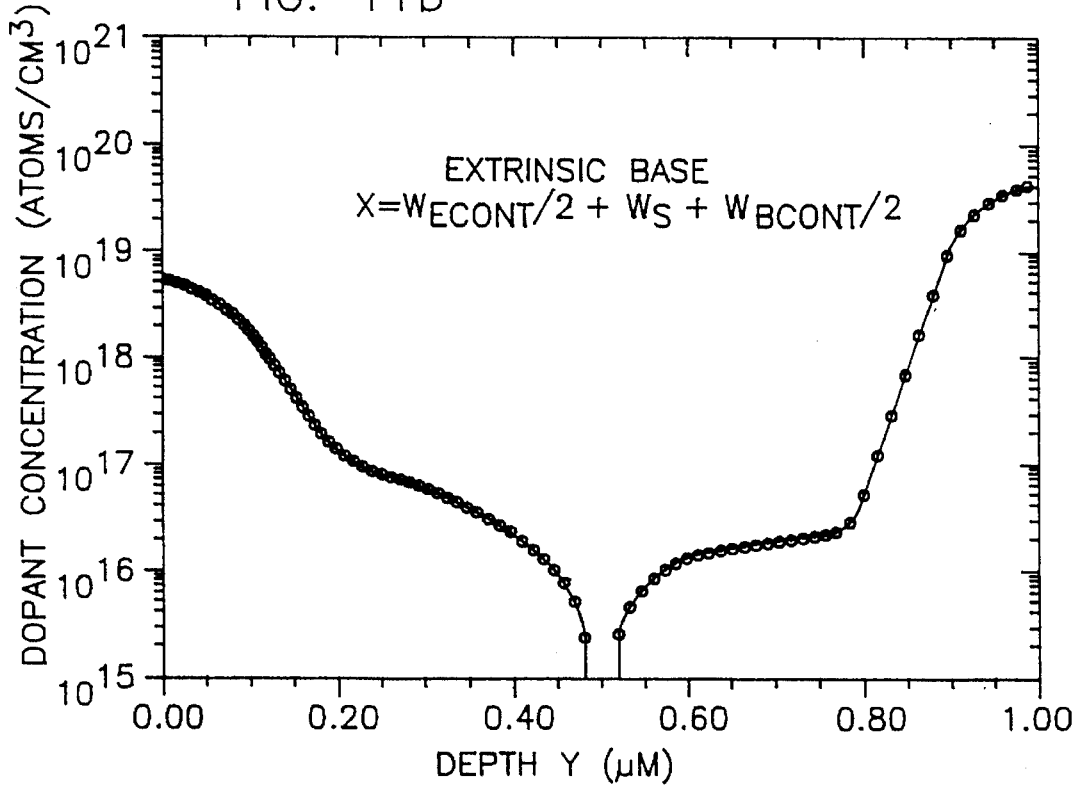
Figure 12:
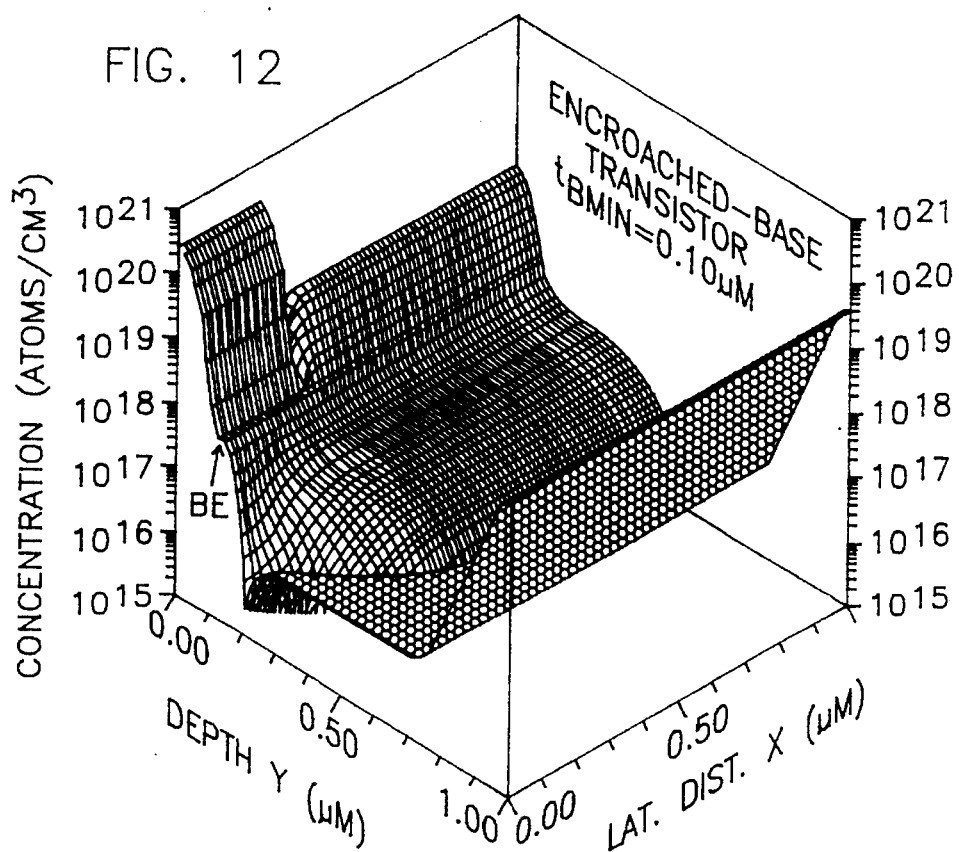
FIG. 12 and 13 are three-dimensional graphs of the doping surfaces respectively for the encroached-base transistor, of FIG. 10 and a simulated baseline transistor.

FIG. 11a shows the dopant concentration of the encroached-base transistor simulated in FIG. 10 along the device centerline (X=0) through the intrinsic base. FIG. 11b shows the dopant concentration of the encroached-base transistor along a vertical line extending through the middle of the extrinsic base (X=$W_{ECONT}/2+W_S+W_{BCONT}/2$). FIG. 12 illustrates a three-dimensional representation of the dopant concentration in the encroached-base transistor of FIG. 10. Arrow BE in FIG. 12 indicates the dopant-concentration minimum that represents the location of the emitter-base junction.

Figure 13:
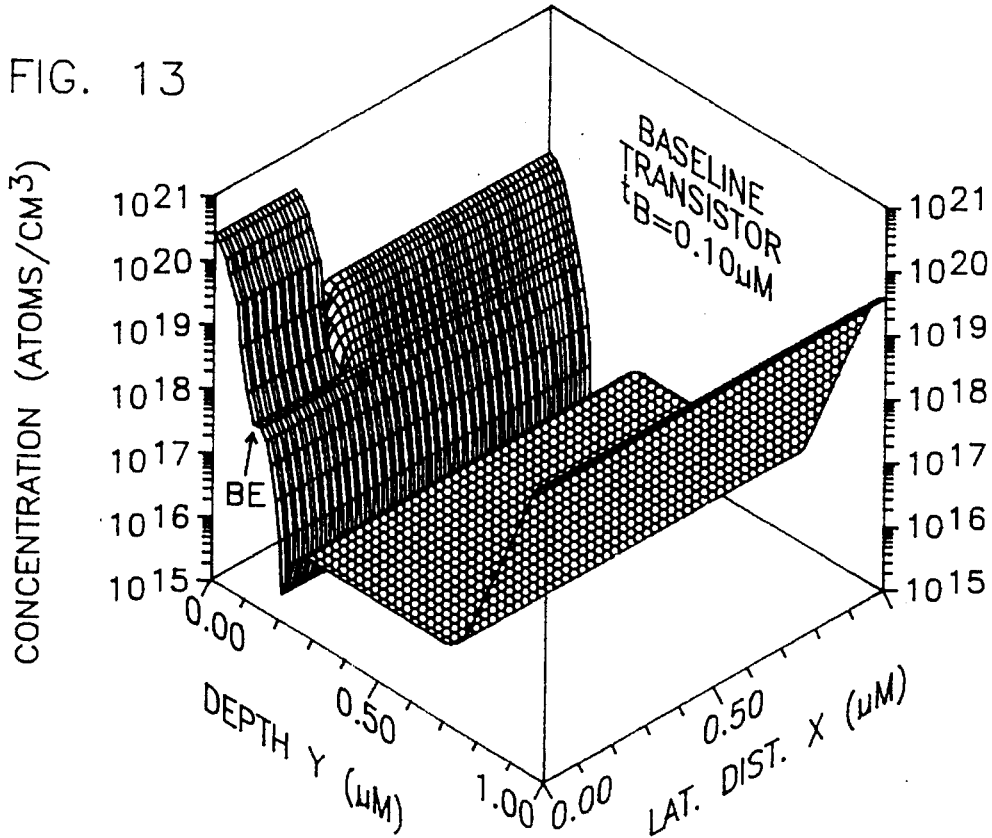

The simulations on the transistor of FIG. 10 were compared to Medici simulations performed on a baseline vertical bipolar transistor configured in the same way as the simulated encroached-base transistor except that encroaching base portions 66 were deleted. The values of all the other parameters in the simulations on the baseline transistor were the same as those in the simulations on the encroached-base transistor. FIG. 13 presents a three-dimensional representation of the dopant concentration in the baseline transistor. Arrow BE again indicates the dopant-concentration minimum representing the emitter-base junction.

The depth of the intrinsic base layer in the baseline transistor was 0.20 μm, just as in the encroached-base simulated transistor. Because the baseline transistor lacked deep encroaching base portions 66, the 0.20-μm depth of the intrinsic base layer was also the depth of the substantially flat collector-base junction in the baseline transistor. Accordingly, base thickness $t_B$ of the baseline transistor was also its minimum vertical base thickness. Since emitter thickness $t_E$ was 0.10 μm, both $t_{BMIN}$ for the encroached-base transistor of FIG. 10 and (minimum) base thickness $t_B$ for the baseline transistor equaled 0.10 μm in the simulations.

Figure 14:
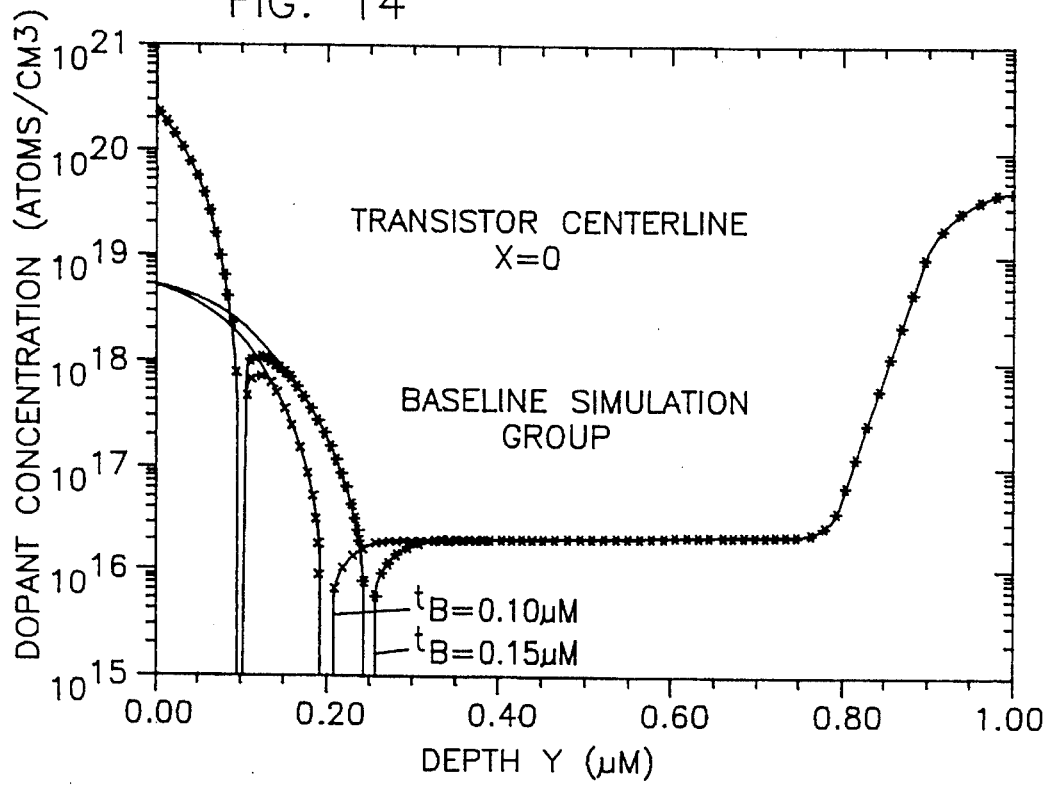
FIG. 14 is a graph for dopant concentration as a function of depth for two simulated transistors in a baseline, simulation group. The two simulated transistors in FIG. 14 have the extreme dopant profiles considered in the baseline simulation group.

For additional comparison purposes, a computer simulation experiment was performed in which the doping profile of a vertical bipolar transistor having a substantially flat collector-base junction situated at a depth of 0.25 μm but lacking the deep encroaching base portions of the present invention was adjusted in such a way as to reduce the collector-base junction depth in five 0.01-μm steps, thereby reaching the baseline transistor. These five steps correspond to reducing base thickness $t_B$ from approximately 0.15 μm to the 0.10-μm value of our baseline transistor. The values of all the other parameters were the same as in the simulations on the encroached-base transistor. The six simulated transistors which lacked the encroached-base portions of the invention are referred to here collectively as the "baseline simulation group". FIG. 14 depicts the centerline dopant profile for the particular baseline simulation-group transistors having the 0.15-μm and 0.10-μm base thicknesses—i.e., the extreme values of the $t_B$ range considered in the simulations.

Figure 15:
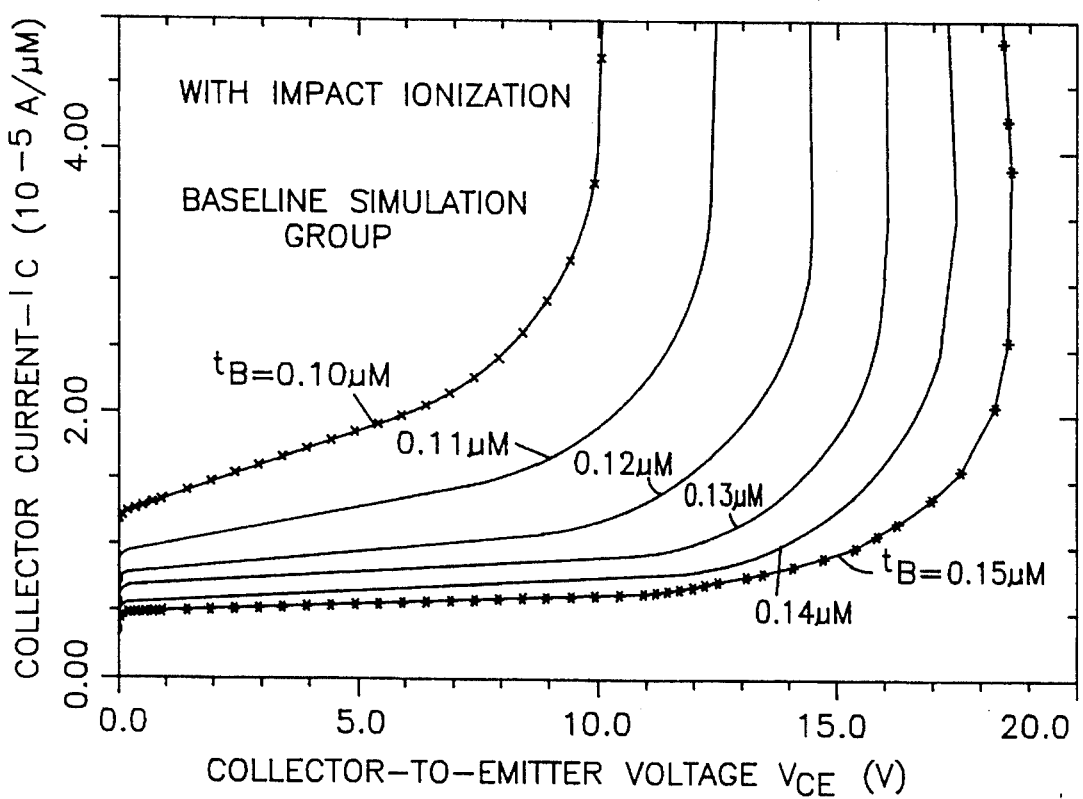
FIG. 15 is a graph for collector current as a function of collector-to-emitter voltage for all the simulated, transistors in the baseline simulation group.

The results of the simulations on the baseline simulation group are summarized in FIG. 15 in terms of the output I–V characteristics—i.e., collector current $I_C$ as a function of collector-to-emitter voltage $V_{CE}$—for all six transistors in the baseline simulation group. Base-emitter voltage $V_{BE}$ was fixed at 0.8 V. In light of the consideration/non-consideration of impact ionization in certain of the simulations as discussed further below, note that the impact ionization of the Medici program was employed in the simulations of FIG. 15.

Reducing base thickness $t_B$ from 0.15 μm to 0.10 μm in the baseline simulation group caused collector current $I_C$ to increase by a factor of approximately 2.5 as indicated in FIG. 15. However, the slopes of the output I–V curves increase greatly with decreasing $t_B$. This is undesirable.

For example, at a $V_{CE}$ of 5 V, the slope of the I–V curve for the baseline transistor (0.10-μm $t_B$) was over 15 times the slope of the I–V curve for the transistor having the 0.15-μm $t_B$. Accordingly, the baseline transistor had much lower Early voltage $V_A$ and punch-through voltage $V_P$ than the transistor whose $t_B$ was 0.15 μm. In short, reducing base thickness $t_B$ in the baseline simulation group in an effort to increase collector current $I_C$ and cutoff frequency $f_T$ caused voltages $V_P$ and $V_A$ to be substantially degraded.

FIGS. 16a–27 illustrate the simulated performance of the encroached-base transistor of FIG. 10, partly in comparison with the baseline transistor. Unless otherwise indicated, base-emitter voltage $V_{BE}$ is 0.8 V in each of FIGS. 16a–27. In order to differentiate between the simultaneous effects of impact ionization generation and direct current injection from the emitter-base junction, the simulations in FIGS. 16a–23 were done with the impact ionization turned off in the Medici software. Impact ionization was employed in the simulations of FIGS. 24–27.

Figure 16A:
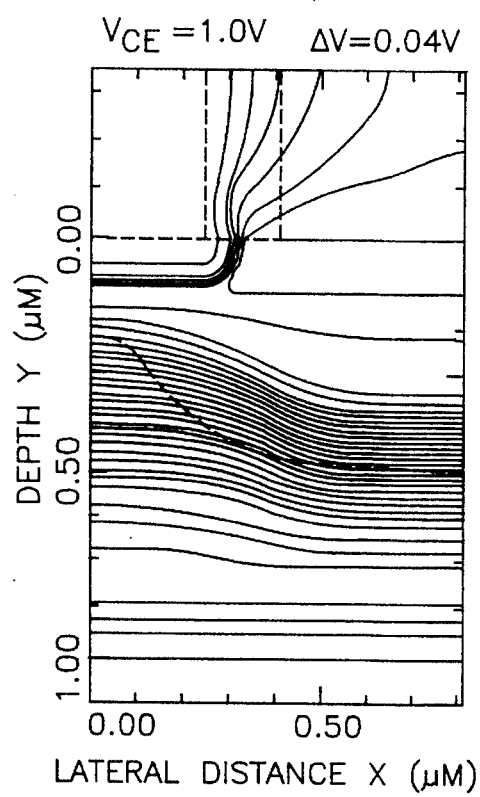
FIGS. 16a, 16b, and 16c graphs illustrating lines of constant potential for different values of collector-to-emitter voltage in the encroached-base transistor of FIG. 10.
Figure 16B:
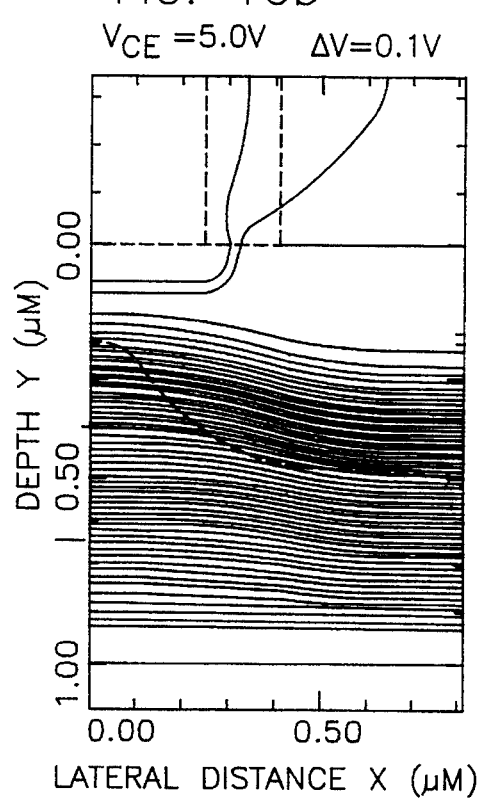
Figure 16C:
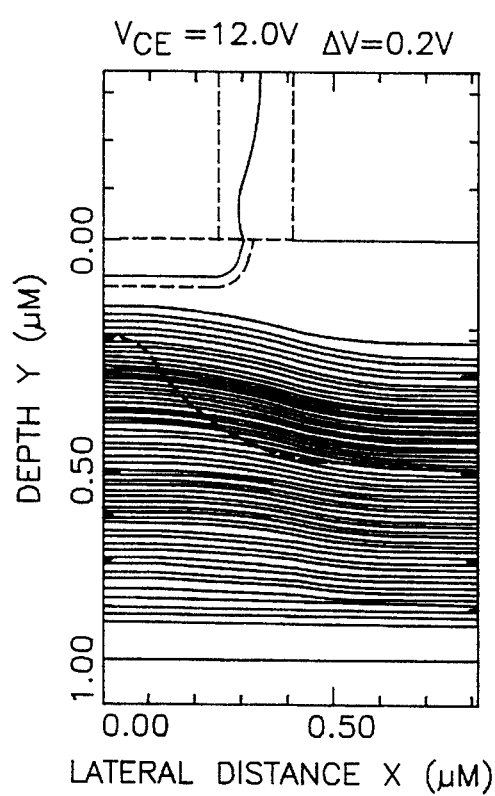

The electrostatic operation of the encroached-base transistor of FIG. 10 is illustrated in FIGS. 16a–16c (collectively "FIG. 16") for collector-to-emitter voltage $V_{CE}$ respectively at 1, 5, and 12 V. The solid lines in FIG. 16 represent the lines of constant potential at the indicated steps ($\Delta V$) in potential. From an examination of FIG. 16, it is apparent that the thickness $t_{BEFF}$ of the electrically neutral region of the intrinsic base does not vary significantly, at least up to $V_{CE}$ equal to 5 V, despite the large variation in the actual thickness $t_B$ of the metallurgical intrinsic base.

Furthermore, the simulations show that the average electrical thickness of the intrinsic base in the encroached-based simulated transistor is 15–25% less than the average electrical thickness of the intrinsic base in the baseline transistor. Using the transistor of the present invention, properties such as cutoff frequency $f_T$, collector current $I_C$, and the current gain, which require a thin base are at least as good, and possibly better, than in the baseline transistor even though the metallurgical base in the invention is significantly thicker than in the baseline transistor.

Figure 17A:
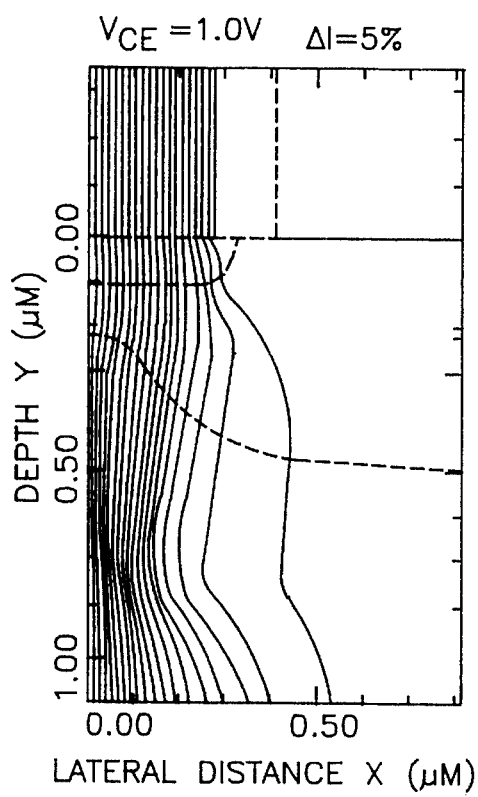
FIGS. 17a, 17b, and 17c are graphs for current flow at different values of collector-to-emitter voltage in the encroached-base transistor of FIG. 10.
Figure 17B:
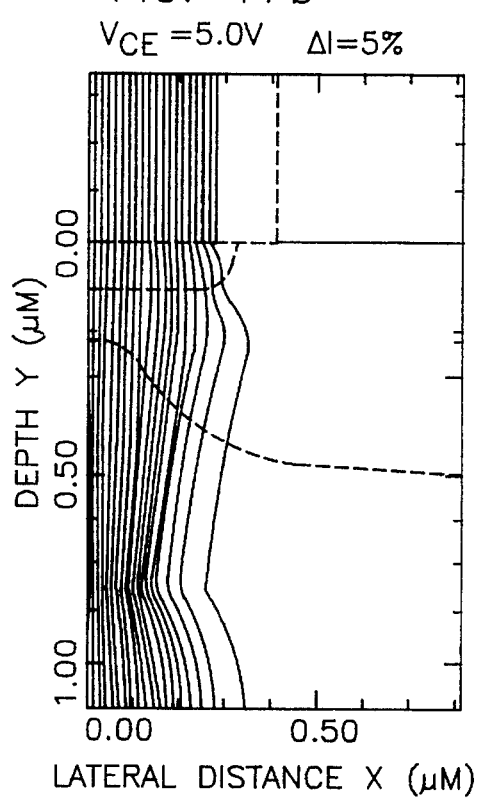
Figure 17C:
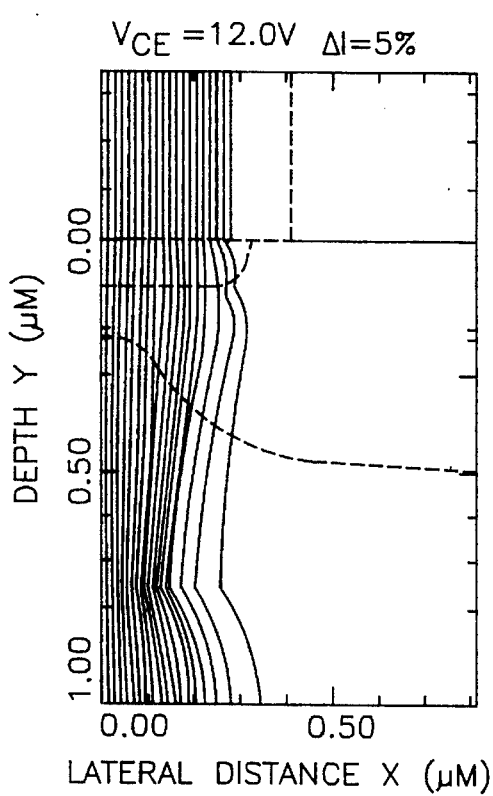

FIG. 17a–17c (collectively "FIG. 17") illustrate the electrokinetic operation of the encroached-base transistor of FIG. 10 at the same respective values of collector-to-emitter voltage $V_{CE}$ as in FIG. 16. The solid lines in FIG. 17 represent current-flow contours at 5% increments (ΔI). As FIG. 17 shows, current moves in the vertical direction with little non-uniformity at the injecting emitter-base junction even though there is a large non-uniformity in metallurgical base thickness $t_B$ across the intrinsic base.

Figure 18:
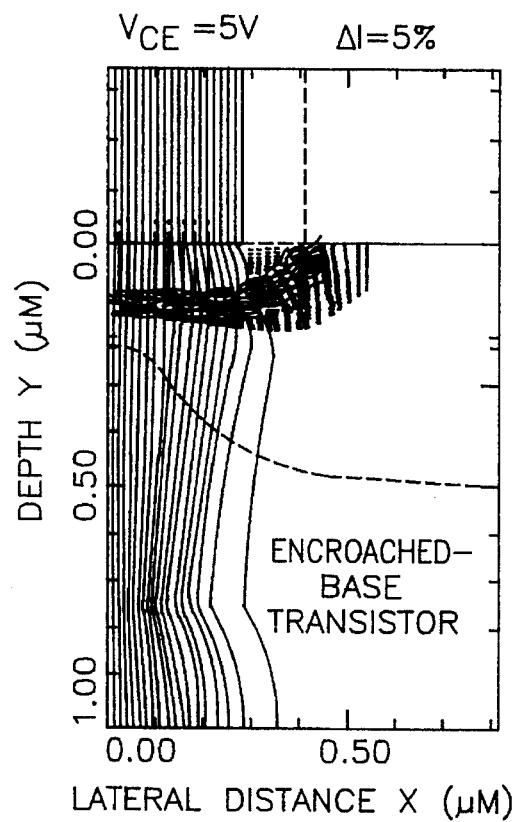
FIGS. 18 and 19 are graphs for current flow, both electrons and holes, respectively for the encroached-base transistor of FIG. 10 and the simulated baseline transistor.
Figure 19:
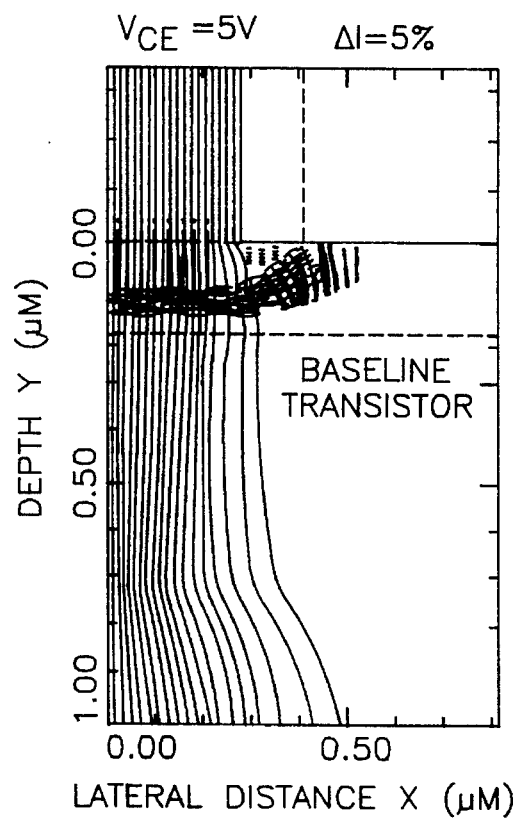

FIG. 18 illustrates an extension of FIG. 17b to which vector plots of hole current are added for the encroached-base transistor of FIG. 10. FIG. 19 presents a composite representation of the vector hole current for the baseline transistor at the same $V_{CE}$ value as in FIG. 18. The current spreading in the encroached-base transistor is greater than in the baseline transistor. This indicates that encroaching base portions 66 contribute to lowering the base resistance $r_B$ of the encroached-base transistor.

Figure 20:
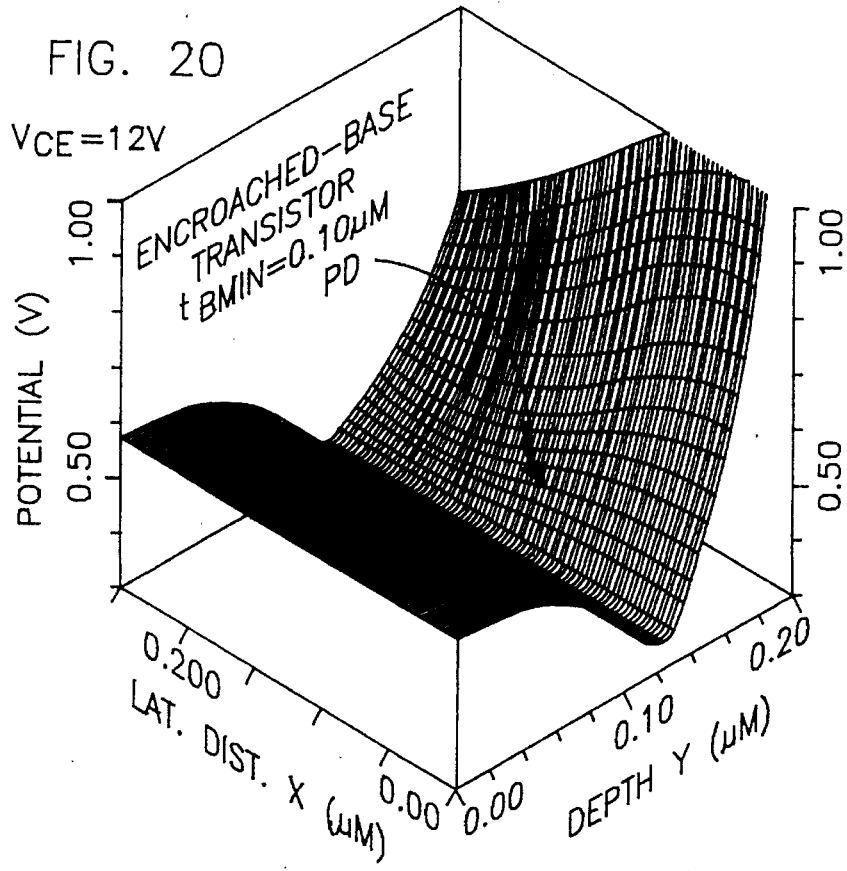
FIGS. 20 and 21 are graphs for the potential surfaces respectively for the encroached-base transistor of FIG. 10 and the simulated baseline transistor.
Figure 21:
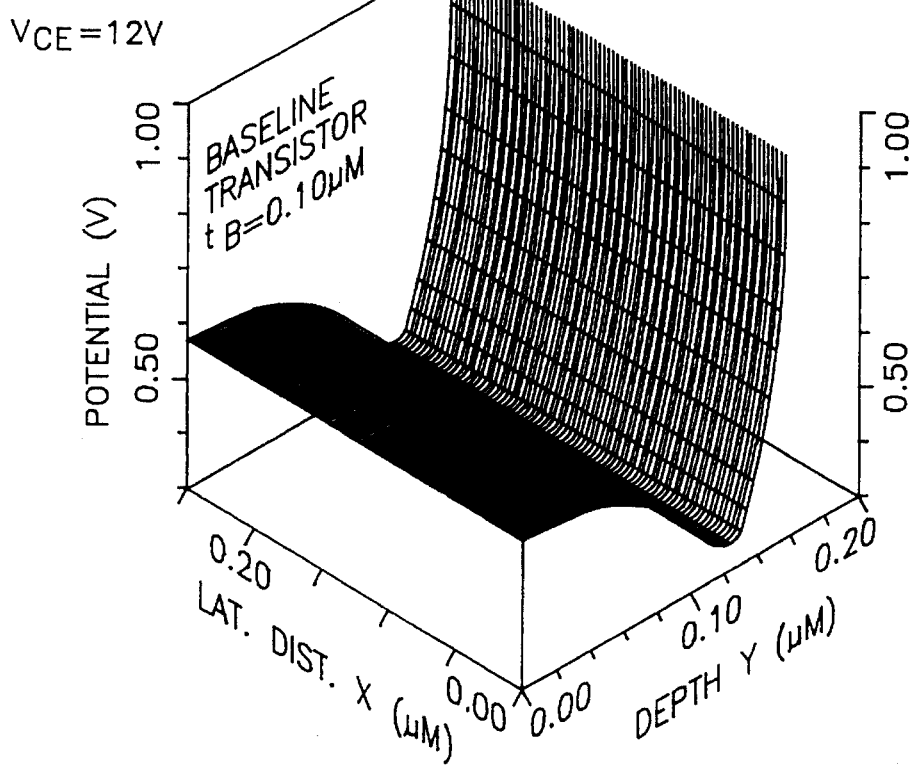

FIGS. 20 and 21 present three-dimensional representations of the potential that electrons see in moving respectively through a central region of the encroached-base transistor of FIG. 10 and a corresponding central region of the baseline transistor. Collector-to-emitter $V_{CE}$ is 12 V in both of FIGS. 20 and 21.

The charge-sharing effect responsible for the improved performance in the present invention can be seen by comparing FIG. 20 to FIG. 21. As indicated by arrow PD in FIG. 20, the potential surface of the encroached-base transistor is pushed down near the center of the emitter-base junction, thereby flattening the bottom of the potential surface and raising the magnitude of the potential barrier that electrons must overcome to enter the base. On the other hand, FIG. 21 shows that the baseline transistor has a non-distorted potential distribution with a less-flattened bottom and a smaller barrier potential. The differences in shape of the potential surface and in magnitude of the barrier potential to electron flow can be seen even more clearly in FIG. 22 which depicts the potential distributions along the centerlines of both transistors.

Figure 2B:
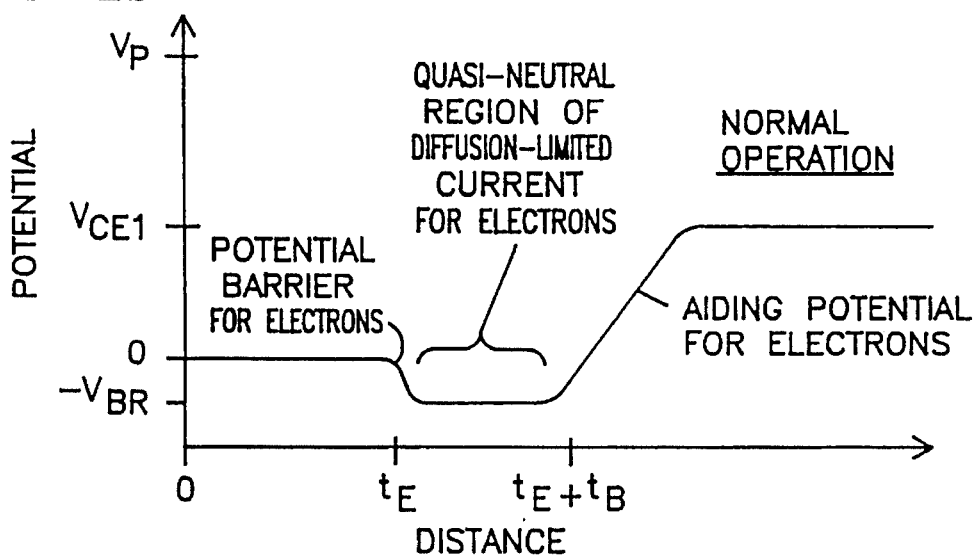
Figure 22:
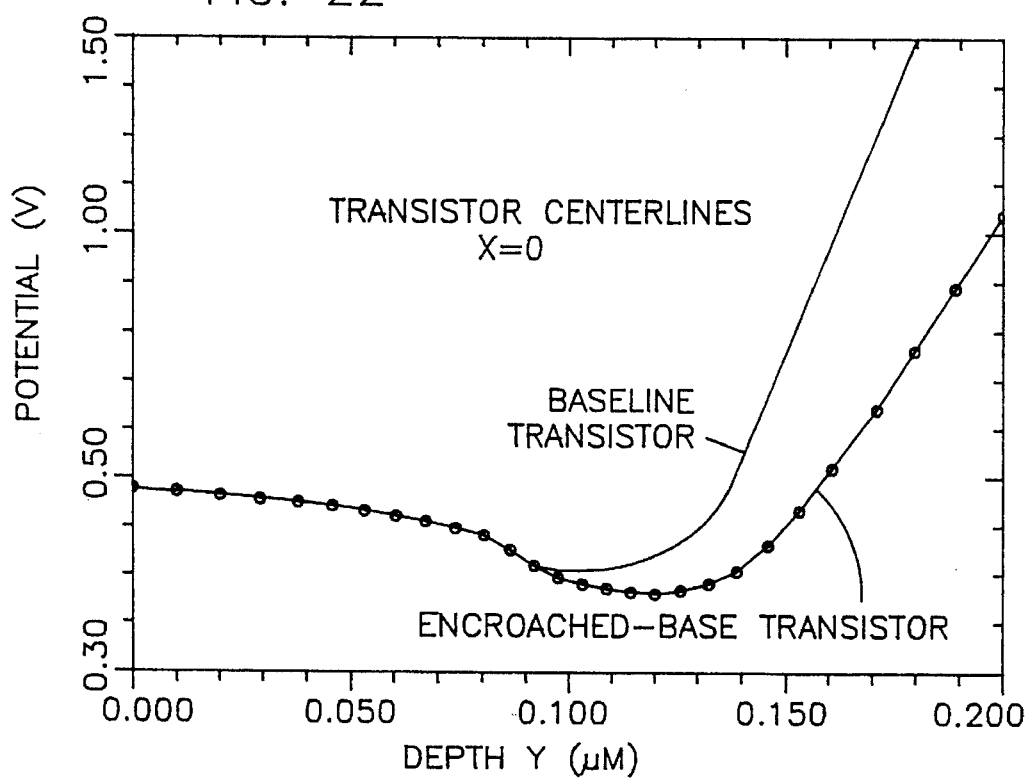
FIG. 22 is a graph for potential as a function of depth for the encroached-base transistor of FIG. 10 and the simulated baseline transistor.

The relatively flat bottom of the potential distribution shown in FIGS. 20 and 22 for the encroached-base transistor corresponds to diffusion-limited resistance to electron flow through the base. Because diffusion limits electron movement in the base, collector-to-emitter voltage $V_{CE}$ has only a small influence on the magnitude of collector current $I_C$. That is, the flattened bottom of the potential curve for the encroached-base transistor represents the quasi-neutral base region which, as can be seen by comparison to FIG. 2b, occurs when the transistor is not in a punch-through condition.

In contrast to the flattened bottom of the potential surface in the encroached-base transistor, FIGS. 21 and 22 show that the potential distribution for the baseline transistor rises rapidly after passing a potential minimum. The less-flattened bottom of the potential distribution indicates that there is less diffusion resistance to electron movement through the base. Collector-to-emitter voltage $V_{CE}$ strongly controls base-to-emitter voltage $V_{BE}$ and readily pulls the potential curve upward to reduce the magnitude of the barrier potential. The baseline transistor is much closer to punch-through than the encroached-base transistor of FIG. 10.

Along the centerlines of the two transistors, the potential for the encroached-base transistor drops 20–30 mvolts lower than the potential for the baseline transistor as shown in FIG. 22. While this is only about 10% of the total potential barrier at the emitter-base junctions of the two transistors, the effect on the current flow is large because the current varies exponentially with the magnitude of the barrier potential. Moreover, collector-to-emitter voltage $V_{CE}$ is directly applied to the potential barrier in the baseline transistor, thereby causing its collector current $I_C$ to rise rapidly with increasing $V_{CE}$. FIGS. 20–22 thus show that the magnitude of punch-through voltage $V_P$ is greater in the encroached-base transistor than in the baseline transistor. The same applies to Early voltage $V_A$.

Figure 23:
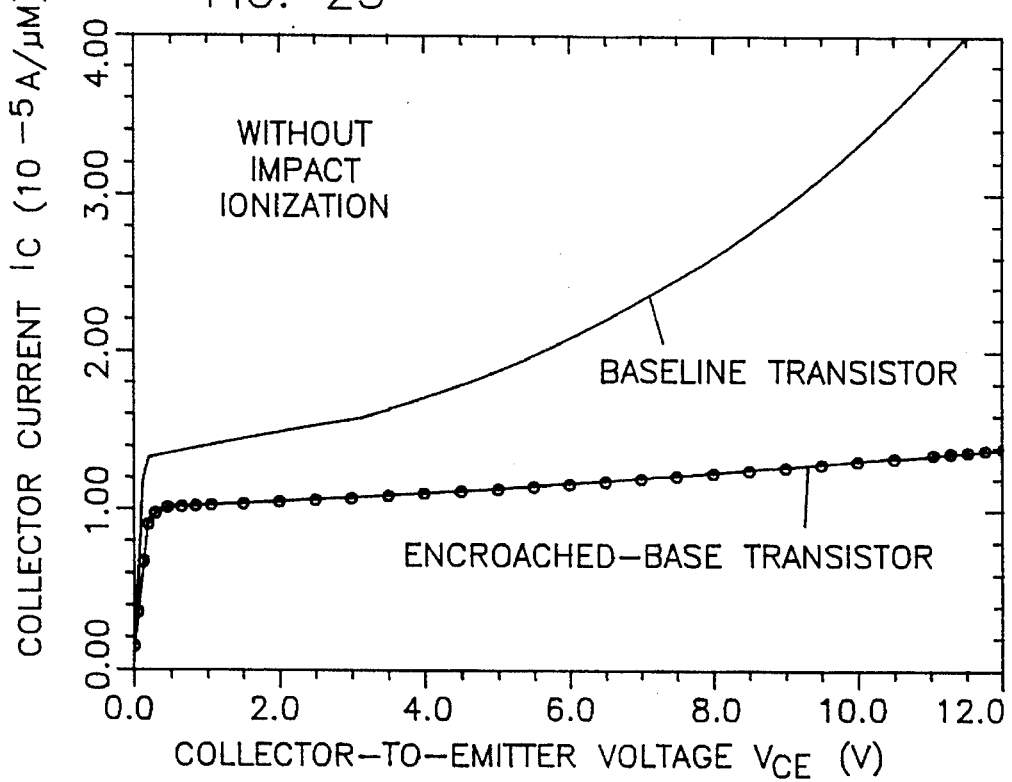
FIGS. 23 and 24 are graphs for collector current as a function of collector-to-emitter voltage for the encroached-base transistor of FIG. 10 and the simulated baseline transistor for respective situations in which impact ionization is absent and present.

FIG. 23 directly compares the output I–V characteristics of the encroached-base transistor of FIG. 10 and the baseline transistor. Although collector current $I_C$ is somewhat higher in the baseline transistor, the slope of the I–V curve for the encroached-base transistor is much less than for the baseline transistor. This likewise shows that the encroached-base transistor has much better punch-through voltage $V_P$ and Early voltage $V_A$ than the baseline transistor. Since the impact ionization was turned off for the simulation in FIG. 23, it is clear that the increased slope of the simulated I–V characteristics in the baseline transistor is associated with the baseline transistor approaching a punch-through condition.

Impact ionization in the base of a bipolar transistor produces avalanche multiplication of charge carriers when the $V_{CE}$ magnitude is raised to a sufficiently high magnitude. As with punch-through, avalanche charge-carrier multiplication causes the number of charge carriers that move across the collector-base junction to increase rapidly with increasing $V_{CE}$ magnitude. The base essentially breaks down. The collector-to-emitter breakdown voltage is the $V_{CE}$ value at which collector current IC increases rapidly with increasing $V_{CE}$ magnitude due to a mechanism such as punch-through or avalanche multiplication.

Figure 24:
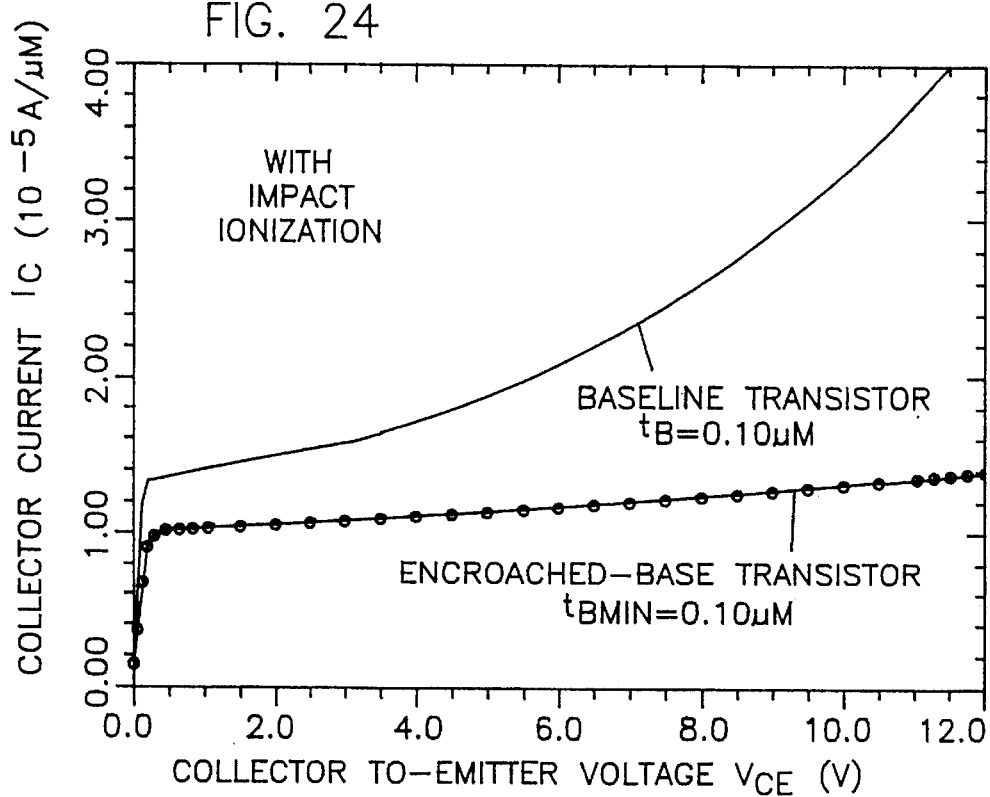

The I–V simulation of FIG. 23 was, as mentioned above, performed with the impact ionization turned off in the Medici program. FIG. 24 presents a corresponding I–V simulation with the impact ionization turned on. Comparison of FIG. 24 to FIG. 23 indicates that the output I–V characteristics of the encroached-base transistor relative to those of the baseline transistor are even better when the impact ionization is employed in the simulations. The I–V curve for the encroached-base transistor is not changed significantly, whereas the I–V curve for the baseline transistor rises more rapidly when the impact ionization is present. This indicates that the magnitude of the collector-to-emitter breakdown voltage in the baseline transistor is close to or less than the magnitude of its punch-through voltage $V_P$ when impact ionization is taken into consideration.

The apparent reason for the preceding differences is that, compared to the baseline transistor, the electric field for the encroached-based transistor is shifted towards lower values, thereby making it considerably less sensitive to impact ionization over the range of applied voltages of interest. This is confirmed by the simulations of FIG. 25 and 26 which respectively depict three-dimensional representations of the electric fields in the two simulated transistors at a $V_{CE}$ of 12 V. The dopant distribution around the collector-base junction is more graded in the encroached-based transistor than in the baseline transistor. The less abrupt field variation in the encroached-base transistor is propagated into its intrinsic base.

Figure 27:
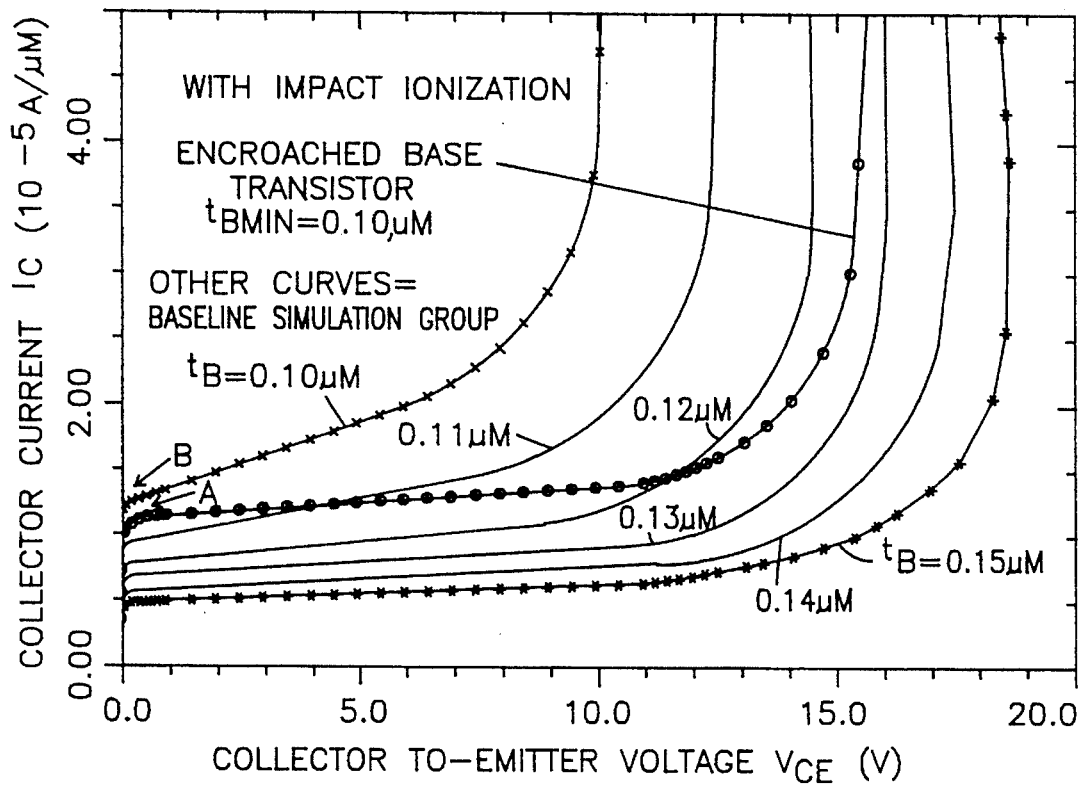
FIG. 27 is a graph for collector current as a function collector-to-emitter voltage for the encroached-base transistor of FIG. 10 and all the transistors in the baseline simulation group.

FIG. 27 presents output I–V characteristics for the encroached-based transistor and all six transistors in the baseline simulation group for the case in which the impact ionization is present. In addition to having better output I–V characteristics than the baseline transistor, the encroached-based transistor has better output I–V characteristics than any of the other five transistors in the baseline simulation group.

For example, across the 0-to-12-V $V_{CE}$ range of interest, the encroached-based transistor of FIG. 10 has approximately the same I–V slope as the 0.15-μm $t_B$ baseline simulation-group transistor but provides approximately twice the collector current. At the other end of the $t_B$ spectrum considered in the simulations, the extrapolated active-region value of collector current $I_C$ at zero $V_{CE}$ is only slightly less ($1.0 \times 10^{-5}$ A/μm as indicated by arrow A in FIG. 27 compared to $1.3 \times 10^{-5}$ A/μm as indicated by arrow B in FIG. 27) in the encroached-base transistor of FIG. 10 than in the baseline transistor whose (minimum) base thickness $t_B$ equals minimum base thickness $t_{BMIN}$ of the encroached-base transistor. However, the slope of the I–V curve is much greater (a factor of 5–10 greater) for the baseline transistor than for the encroached-base transistor. Importantly, FIG. 27 indicates that the magnitude of the collector-to-emitter breakdown voltage for the baseline transistor is 10–11 volts. This is too low for many applications where the power supply voltage is 5 volts.

Comparison of the encroached-base transistor of FIG. 10 to the simulation-group transistor having the 0.11-μm $t_B$ is quite useful. Although there is a 0.01-μm difference in the minimum thicknesses of the bases of these two transistors, their zero-$V_{CE}$ extrapolated active-region collector currents are the same ($1.0 \times 10^{-5}$ A/μm as indicated by arrow A in FIG. 27). But, the slope of the I–V curve for the 0.11-μm $t_B$ simulation-group transistor is approximately three times the slope of the I–V curve for the encroached-base transistor. As a result, the collector-to-emitter breakdown voltage is over 20% higher in the encroached-base transistor. This clearly demonstrates the improvement attainable with the invention. The encroached-base transistor furnishes I–V output characteristics which, as a group, are better than in any of the six transistors in the baseline simulation group.

FIGS. 28a–28f (collectively "FIG. 28") illustrate a process for manufacturing the vertical bipolar transistor of FIG. 5 in accordance with the invention. The process of FIG. 28 is typically a modification of a BiCMOS fabrication process such as that described in Ilderem et al, U.S. Pat. No. 5,079,182. Accordingly, n-channel and p-channel insulated-gate field-effect transistors are typically formed as part of an integrated circuit that contains the bipolar transistor of FIG. 5. For simplicity, FIG. 28 and the accompanying process description do not deal with the fabrication of any transistors except that of FIG. 5.

The n-type dopings in the fabrication process are performed with antimony, arsenic, and/or phosphorus. The p-type dopings are done with boron and aluminum.

Figure 28A:
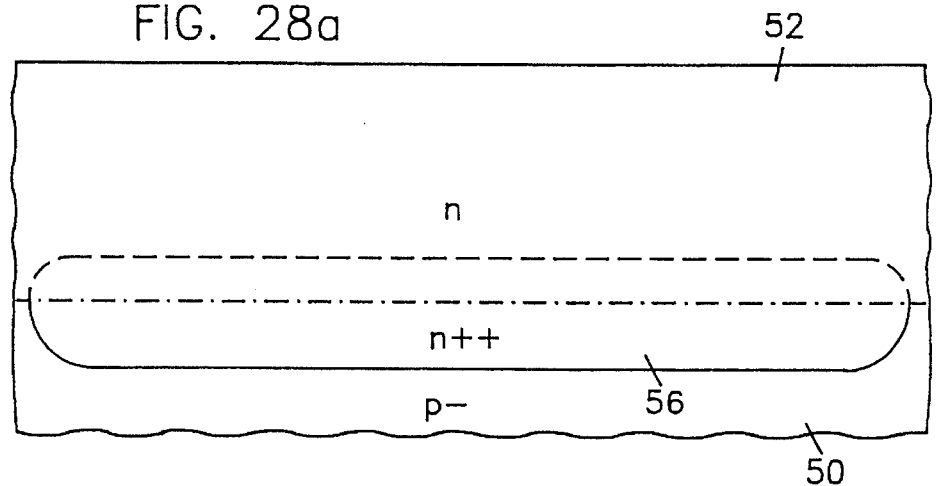
FIGS. 28a, 28b, 28c, 28d, 28e, and 28f are cross-sectional front views representing steps in a process for manufacturing the transistor of FIG. 5 in accordance with the invention.

The starting point is p- substrate 50. Using a suitable masking technique, an n-type dopant is introduced into substrate 50 at the location for n++ buried layer 56. N epitaxial layer 52 is grown on substrate 50. During the epitaxial growth, part of the n-type dopant introduced into substrate 50 outdiffuses to produce buried layer 56 along the interface between substrate 50 and epitaxial layer 52 as shown in FIG. 28a.

Figure 28B:
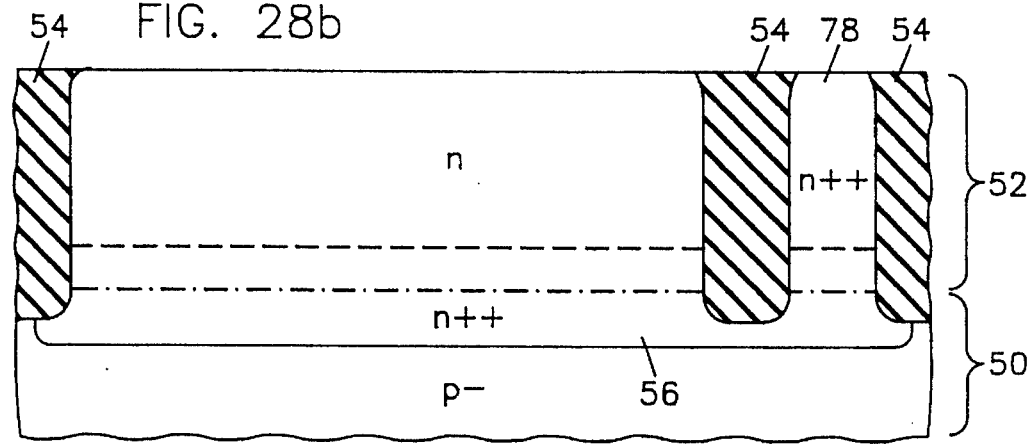

Field-oxide region 54 is formed along the upper semiconductor surface according to a conventional technique. Using a photoresist mask (not shown), an n-type dopant is introduced into the right-hand active semiconductor region to convert its n epitaxial material into n++ collector contact zone 78. FIG. 28b shows the structure at this stage.

A layer 102 of polysilicon is deposited on top of the structure. A thin cap layer 104 of silicon oxide is formed along the top of polysilicon layer 102 by thermal oxidation.

Figure 28C:
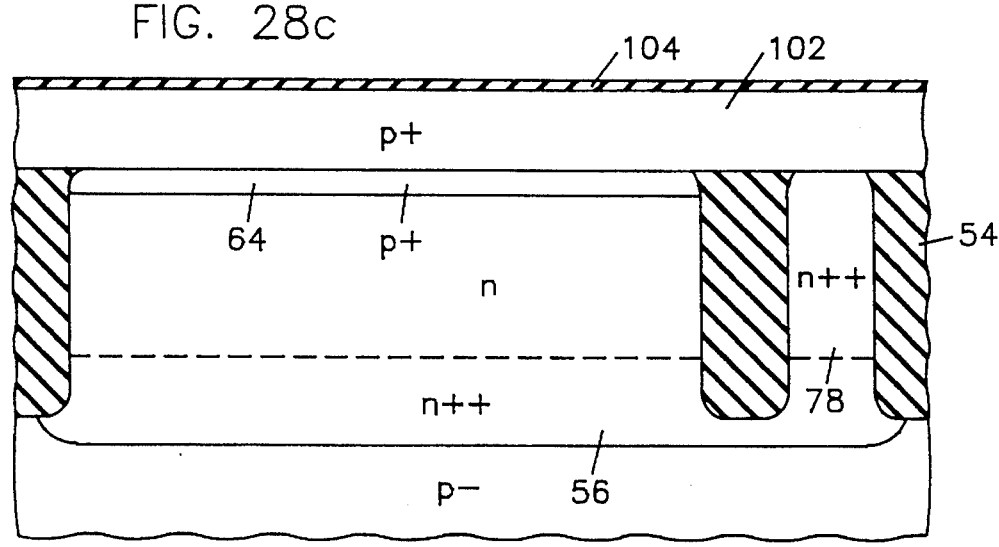

A p-type boron-containing dopant is ion implanted through cap layer 104 into polysilicon layer 102 at a moderate dosage. The structure is subsequently annealed at a temperature, and for a time, sufficient to cause some of the just-introduced boron to diffuse out of polysilicon layer 102 into epitaxial layer 52 to form a precursor to intrinsic base layer 64 in the left-hand active semiconductor region as indicated in FIG. 28c.

Figure 28D:
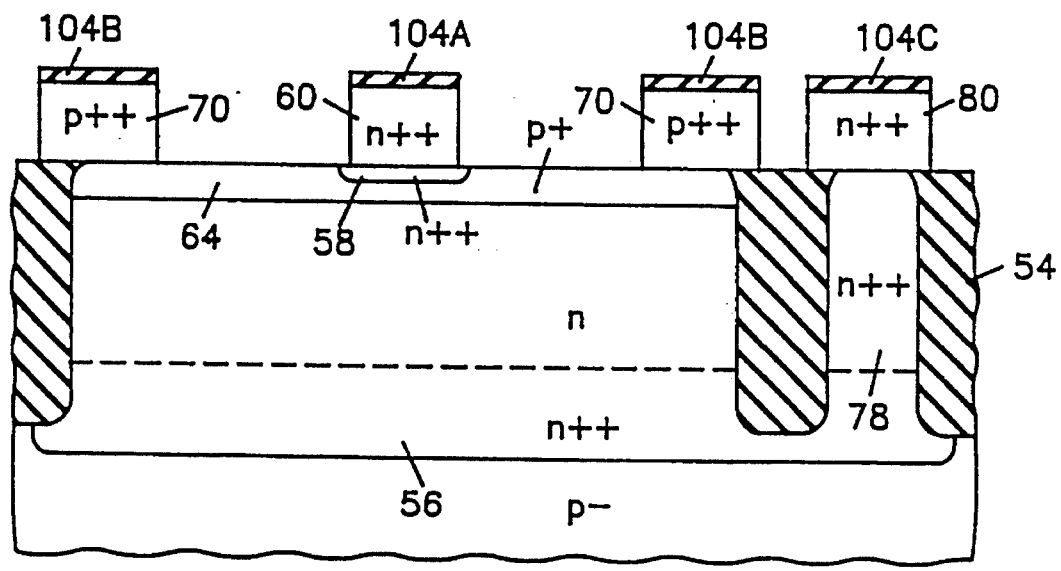
Figure 28E:
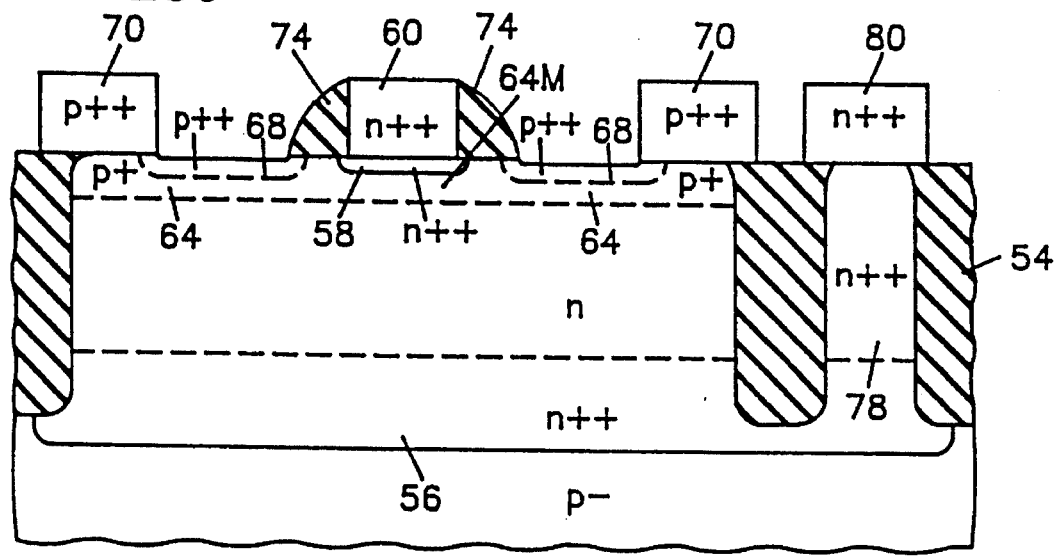

Using a photoresist mask (not shown), an additional p-type boron-containing dopant is ion implanted at a very heavy dosage through cap layer 104 into polysilicon layer 102 at locations for base contact 70. Similarly, an n-type dopant is ion implanted at a very heavy dosage through cap layer 104 into polysilicon layer 102 at locations for emitter contact 60 and collector contact 80 using a suitable photoresist mask (not shown). Using another photoresist mask (not shown), selected parts of layers 104 and 102 are removed to define contacts 60, 70, and 80 in the remaining polysilicon as shown in FIG. 28d. Items 104A, 104B, and 104C respectively indicate the remaining portions of cap layer 104 overlying polysilicon contacts 60, 70, and 80.

Another anneal is typically performed. This anneal may be a separate bipolar step or part of a CMOS process. In any case, part of the n-type dopant in polysilicon emitter contact 60 outdiffuses to form a precursor to emitter 58. Some of the boron in polysilicon base contact 70 may also outdiffuse into p+ layer 64. Such p-type diffusion is not particularly material here and thus is not illustrated in the drawings. FIG. 28d illustrates the structure at the end of this anneal.

A layer of low-temperature oxide is deposited on the upper surface of the structure and anisotropically etched to form spacers 74 along the sidewalls of polysilicon emitter contact 60. Oxide spacers that form simultaneously along the sidewalls of polysilicon contacts 70 and 80 are normally removed using a masked etching procedure. During the etch, a small thickness of the monocrystalline silicon at the exposed areas is typically removed.

Precursors to base contact zones 68 are formed by a procedure in which a p-type boron-containing dopant is introduced into epitaxial layer 52 through exposed parts of its upper surface using spacers 74 and polysilicon emitter contact 60 as a mask to control the lateral growth of p++ base contact zones 68 towards each other. This dopant introduction step can be performed by ion implantation or diffusion.

The structure is subsequently annealed to cause part of the just-introduced boron to diffuse sideways and downward to form the precursors to base contact zones 68. During the anneal, emitter 58 and intrinsic base layer 64 also expand, but to a lesser extent than contact zones 68. FIG. 29e shows the resulting structure.

Deep encroaching base portions 66 are subsequently formed by a procedure in which a fast-diffusing p-type dopant, such as aluminum, is ion implanted into epitaxial layer 52 through exposed parts of its upper surface using spacers 74 and polysilicon emitter contact 60 as a mask to control the lateral growth of encroaching base portions 66 towards each other. Aluminum is utilized as the p-type dopant for creating encroaching base portion 66 because the diffusion coefficient of aluminum is approximately six times the diffusion coefficient of boron.

Figure 28F:
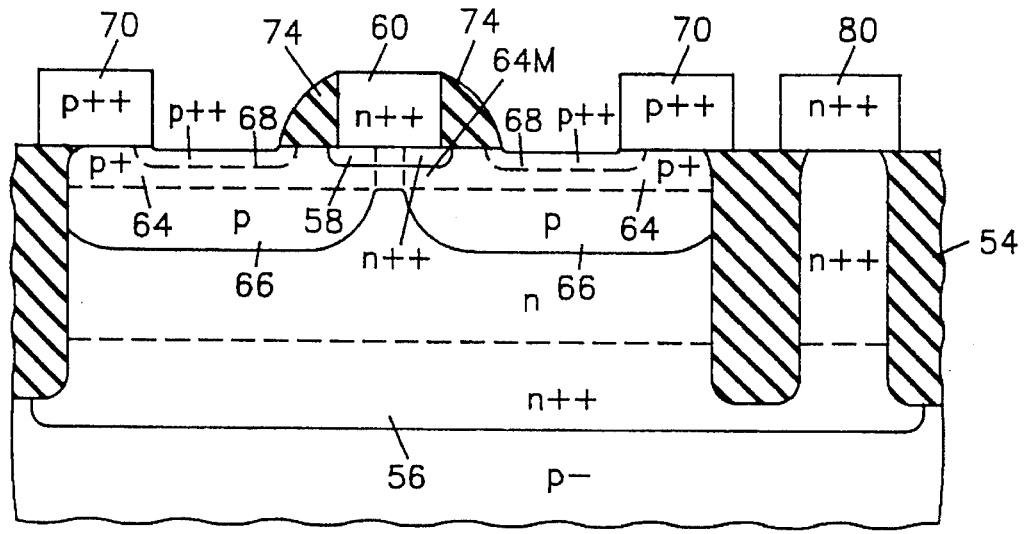

The structure is then annealed to form deep encroaching base portions 66 from the just-introduced aluminum. During the anneal, components 58, 64, 66, and 68 move to their final positions as shown in FIG. 28f. Since the aluminum utilized to form encroaching base portions 66 diffuses much faster than the boron employed to create p+ layer 64 and p++ base contact zones 68, the boron diffusion to establish the final positions for components 64 and 68 is much less than the aluminum diffusion to form encroaching base portions 66. In essence, the process is designed in such a way that the formation of components 58, 64, and 68 is largely independent of the formation of encroaching base portions 66.

Encroaching base portions 66 and base contact zones 68 are self-aligned to spacers 74 and polysilicon emitter contact 60 in the process of FIG. 28. In addition, n++ emitter contact 60 is self-aligned to emitter 58. As a result, components 66 and 68 are self-aligned to emitter 58.

Metal silicide caps 62, 72, and 82 are provided in a conventional way by depositing a layer of a suitable metal on the upper surface of the structure and heating the structure to convert part of the metal into caps 62, 72, and 82. The unreacted metal is removed to produce the structure of FIG. 5.

The process of FIG. 28 can be modified in various ways. For example, the p-type dopant for encroaching base regions 66 could be introduced into epitaxial layer 52 prior to introducing the dopant for base contact zones 68. The last two anneals could be combined into one anneal performed after the dopants for components 68 and 66 are introduced into the substrate. In any case, the value of spacing $S_{NE}$ between encroaching base portions 66 depends on the location of the outside bottom edges of spacers 74. The magnitude of spacing $S_{NE}$ is thereby controlled by appropriately adjusting $W_E$, $W_S$, and/or $d_{DB}$.

Figure 29:
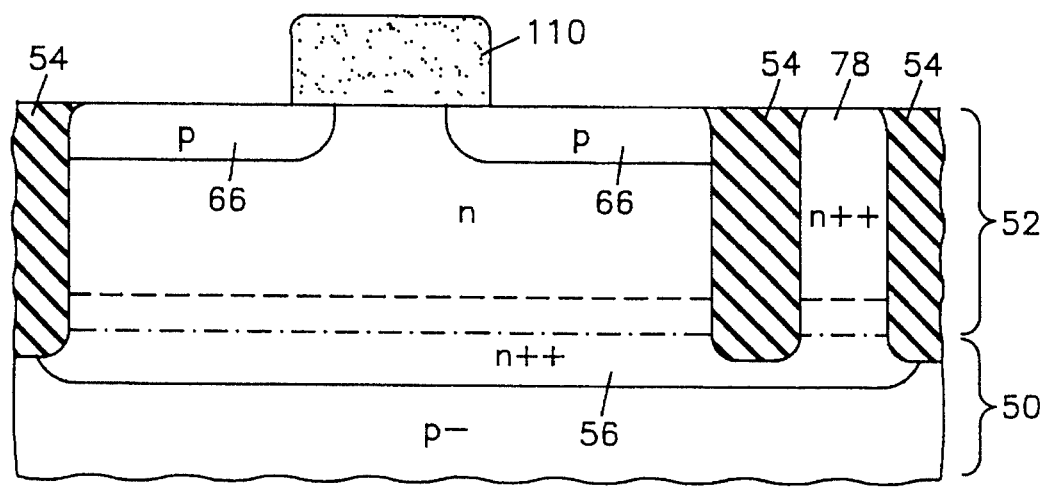
FIG. 29 is a cross-sectional front view representing a step that can be substituted into the process of FIGS. 28a–28f for manufacturing a vertical bipolar transistor in accordance with the invention.

FIG. 29 illustrates how the process of FIG. 28 can be modified to enable a special mask 110 to be employed in controlling the locations of encroaching base portions 66 instead of using spacers 74 and emitter contact 60 for this purpose. In applying the variation of FIG. 29 to the process of FIG. 28, the process steps are the same up to the stage shown in FIG. 28b. At this point, mask 110 is formed on top of the structure as illustrated in FIG. 29. Mask 110 may consist of photoresist.

A p-type boron-containing dopant is introduced into epitaxial layer 52 through the exposed parts of the upper semiconductor surface at locations intended for encroaching base portions 66. Mask 110 thus controls the lateral growth of base portions 66 towards each other. An anneal is subsequently performed to drive the boron sideways and downwards.

The structure of FIG. 29 can now be processed in the way described above for FIGS. 28c–28e. The resultant structure appears very much like the structure of FIG. 28f, except that encroaching base portions 66 are no longer self-aligned to emitter 58. Use of the process modification involving FIG. 29 alleviates the need to use a fast-diffusing dopant, such as aluminum, to create deep encroaching base portion 66. Instead, encroaching base portions 66 are formed with conventional boron prior to the creation of gate layer 58, emitter 64, and base contact zones 68. Thus, the comparatively greater annealing time required for creating deep encroaching base portions 66 does not advance the shallower dopant profiles of components 58, 64, and 68.

Emitter 58 in the transistor of FIGS. 5–8 is in the shape of a stripe having length $L_E$ greater than width $W_E$ as viewed in a direction perpendicular to the upper semiconductor surface. The transistor of FIGS. 5–8 can be expanded to include two or more such emitter stripes.

Figure 30:
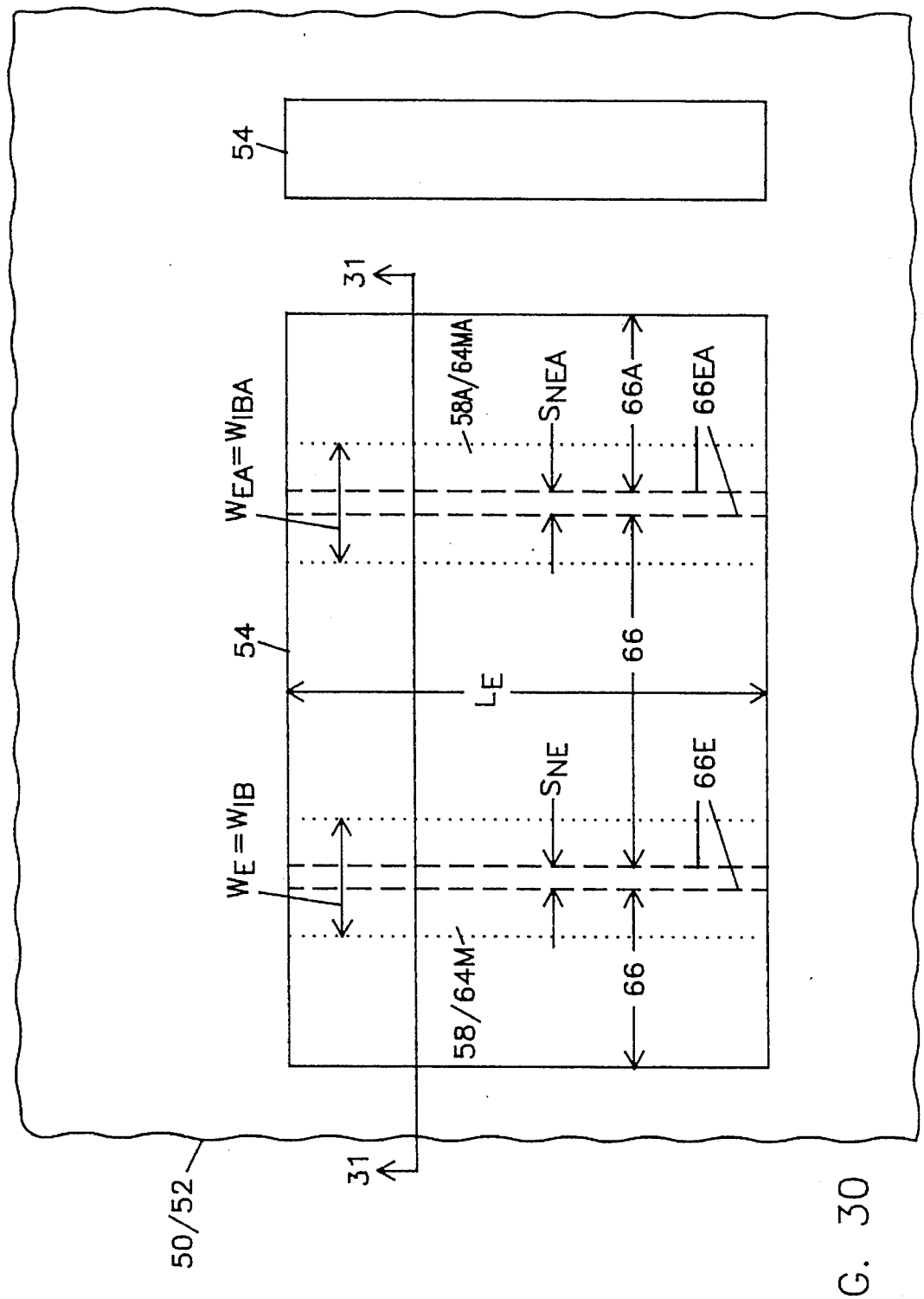
FIGS. 30, 32, 33, and 35 are partial transistor layout views for extension of the layout of FIG. 7 in accordance with the invention.

FIG. 30 illustrates the layout for such an extension in which the so-extended transistor contains an additional very heavily doped n-type emitter stripe 58A that runs parallel to emitter stripe 58. FIG. 31 depicts a cross section for this transistor. The extended transistor of FIGS. 30 and 31 also contains an additional heavily doped p-type main intrinsic base portion 64MA, an additional moderately doped p-type encroaching base portion 66A, and one or two additional heavily doped p-type base contact zones 68A.

In addition to the intrinsic base formed with main intrinsic base portion 64M and the underlying parts of encroaching base portion 66, the transistor in FIGS. 30 and 31 has an intrinsic base formed with additional p+ main intrinsic base portion 64MA and the underlying parts of additional p portion 66A and center p portion 66. The minimum thickness $t_{BMINA}$ of the additional intrinsic base occurs at a location between additional portion 66A and center portion 66.

Additional portion 66A and center portion 66 encroach substantially into the additional intrinsic base. In particular, additional portion 66A and center portion 66 extend sufficiently close to each other below additional main intrinsic base portion 64MA without touching along nearest side edges 66EA that the output I–V characteristics associated with additional intrinsic base portion 64MA, additional encroaching base portion 66A, and center encroaching base portion 66 largely match the improved output I–V characteristics attributable to intrinsic base portion 64M and the two encroaching base portions 66.

To achieve this match, minimum thickness $t_{BMINA}$ of the additional intrinsic base largely equals $t_{BMIN}$. Also, the minimum spacing $S_{NEA}$ between additional encroaching base portion 66A and center encroaching base portion 66 largely equals $S_{NE}$. Accordingly ratio $S_{NEA}/t_{BMINA}$ largely equals ratio $S_{NE}/t_{BMIN}$. Hence, spacing $S_{NEA}$ is less three times, usually less than twice, $t_{BMINA}$. Preferably, $S_{NEA}$ is less than $1.5 t_{BMINA}$. Two-dimensional simulations and experimentation are utilized to set the values of spacings $S_{NE}$ and $S_{NEA}$ according to the desired amount of output I–V improvement.

In the layouts of FIGS. 7 and 30, nearest side edges 66E of encroaching base portions 66 extend parallel to emitter stripe 58. Alternatively, edges 66E could cross emitter stripe 58.

Figure 32:
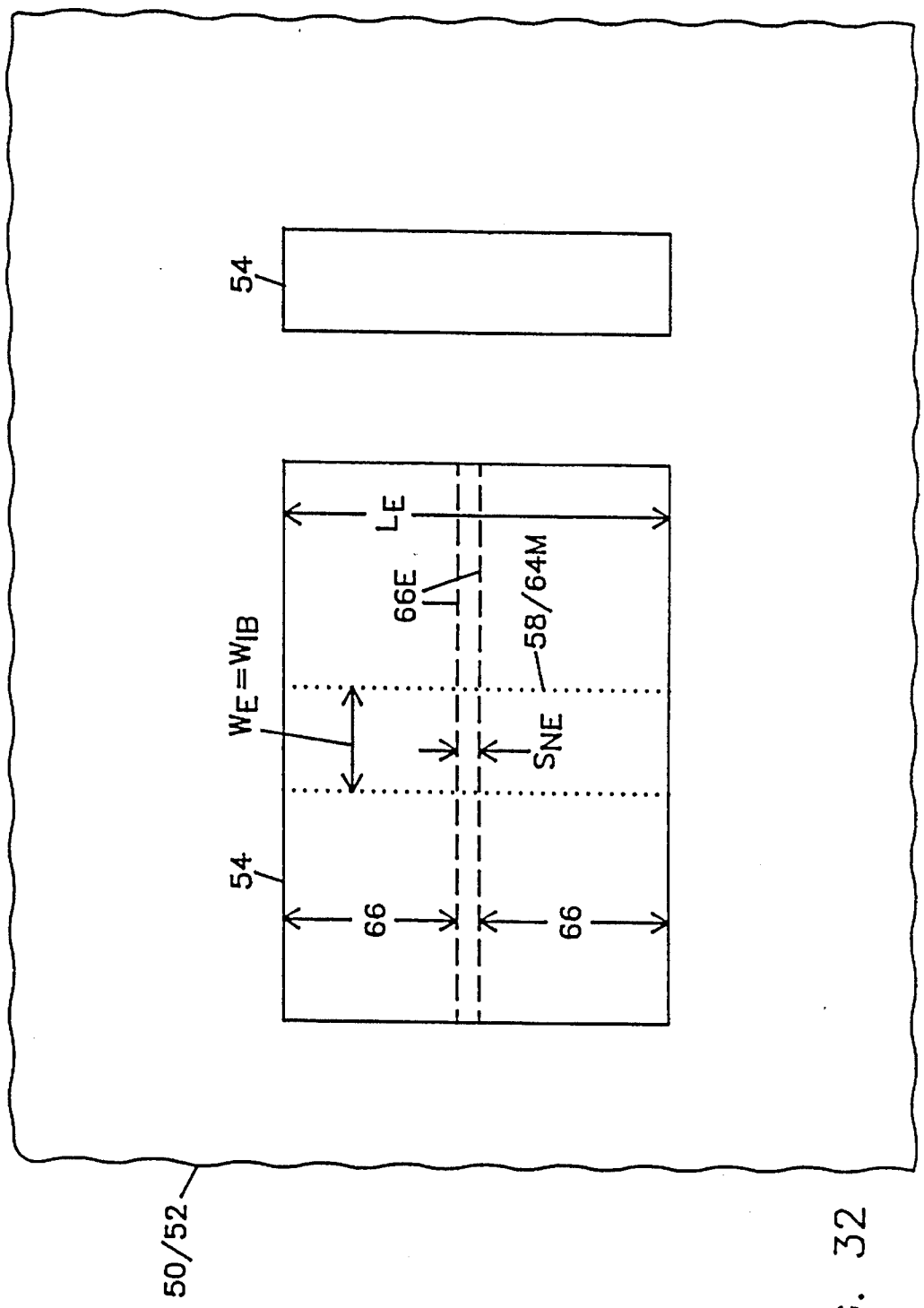

FIG. 32 illustrates a modification of the transistor layout of FIG. 7 in which side edges 66E cross emitter stripe 58 at a right angle. Although part of the geometry is rotated 90°, the $S_{NE}/t_{BMIN}$ relationship presented above for the layout of FIG. 7 applies directly to the layout of FIG. 32.

Figure 33:
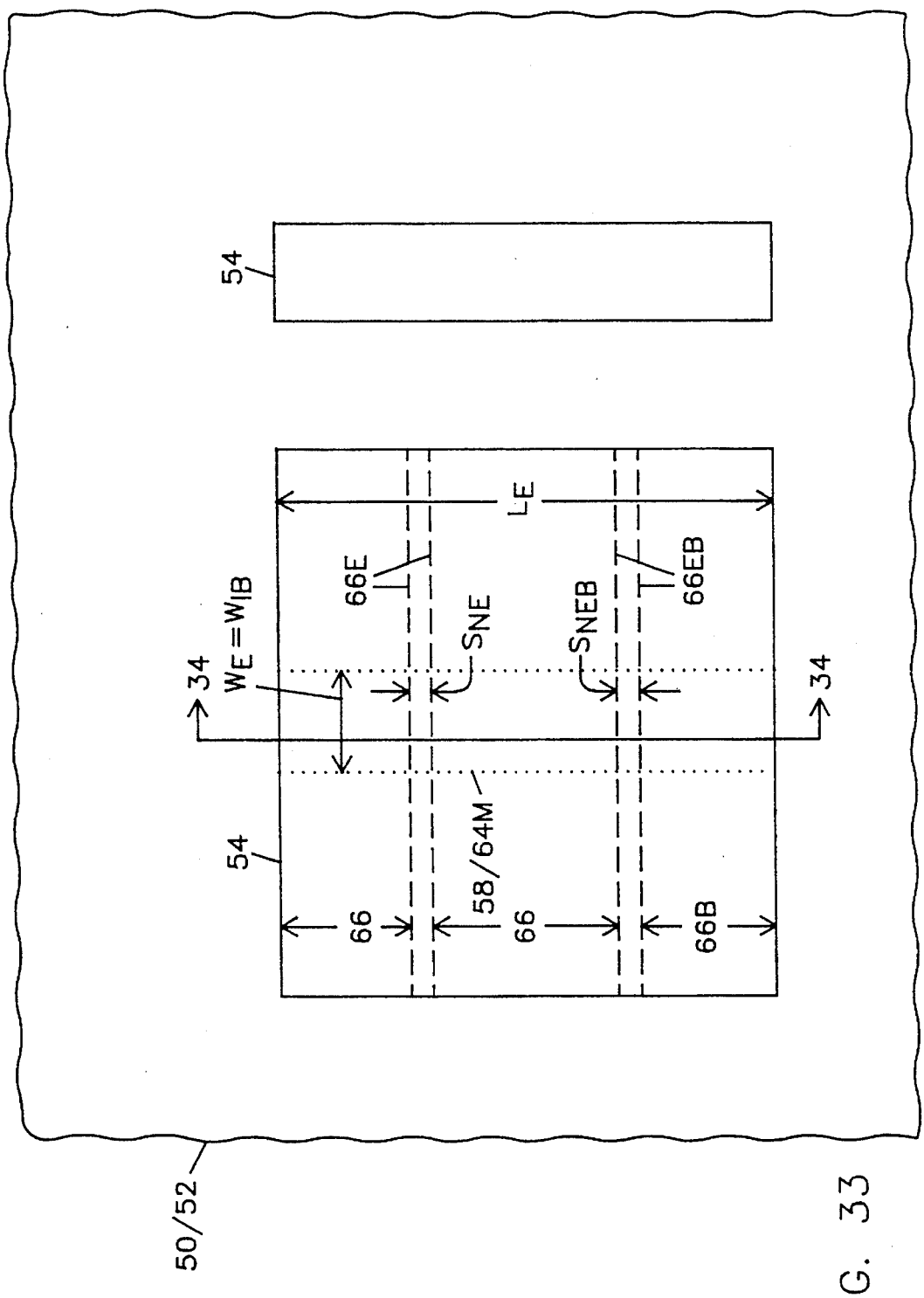

The transistor layout of FIG. 32 can be expanded to include one or more additional encroaching base portions. FIG. 33 illustrates such an extension where there is one additional encroaching base portion 66B. FIG. 34 depicts a cross section for this extension. The nearest side edges 66EB of additional portion 66B and center portion 66 cross emitter stripe 58 at a right angle. Unlike the transistor of FIGS. 30 and 31 where there is an additional intrinsic base, the transistor of FIGS. 33 and 34 has only a single intrinsic base and thus only main intrinsic base portion 64M.

Additional portion 66B and center portion 66 in FIGS. 33 and 34 encroach substantially into the intrinsic base. They extend sufficiently close to each other below main intrinsic base portion 64M without touching one another along nearest side edges 66EB that the output I–V characteristics associated with additional encroaching base portion 66B and center encroaching base portion largely match the improved output I–V characteristics attributable to the two encroaching base portions 66.

The preceding match is attained by arranging for the minimum spacing $S_{NEB}$ between additional encroaching base portion 66B and center encroaching base portion 66 to largely equal $S_{NE}$. Hence, ratio $S_{NEB}/t_{BMIN}$ largely equals ratio $S_{NE}/t_{MIN}$. Accordingly, spacing $S_{NEB}$ is less than three times, usually less than twice, $t_{BMIN}$. $S_{NEB}$ preferably is less than $1.5t_{BMIN}$.

Figure 35:
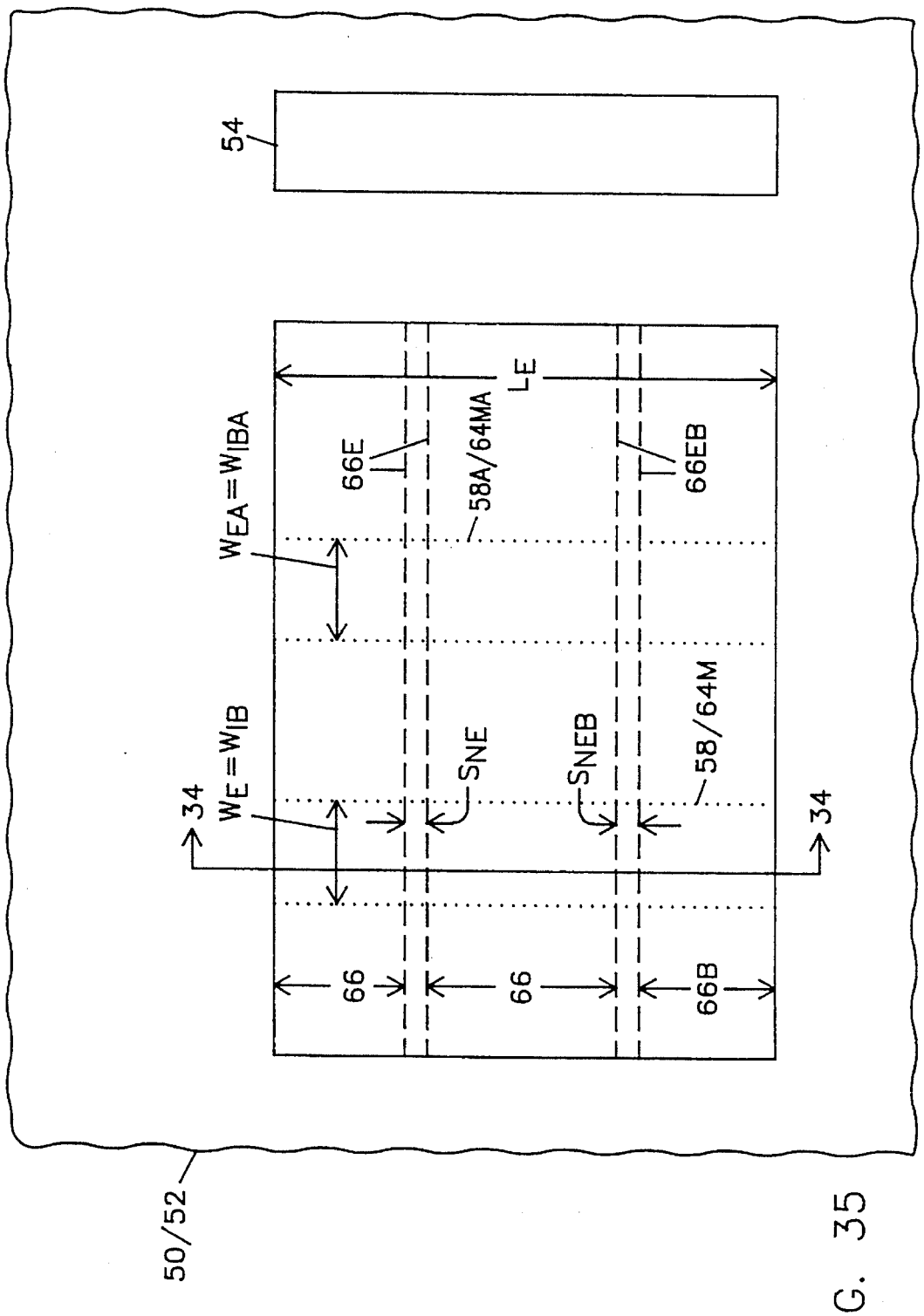
Figure 36:
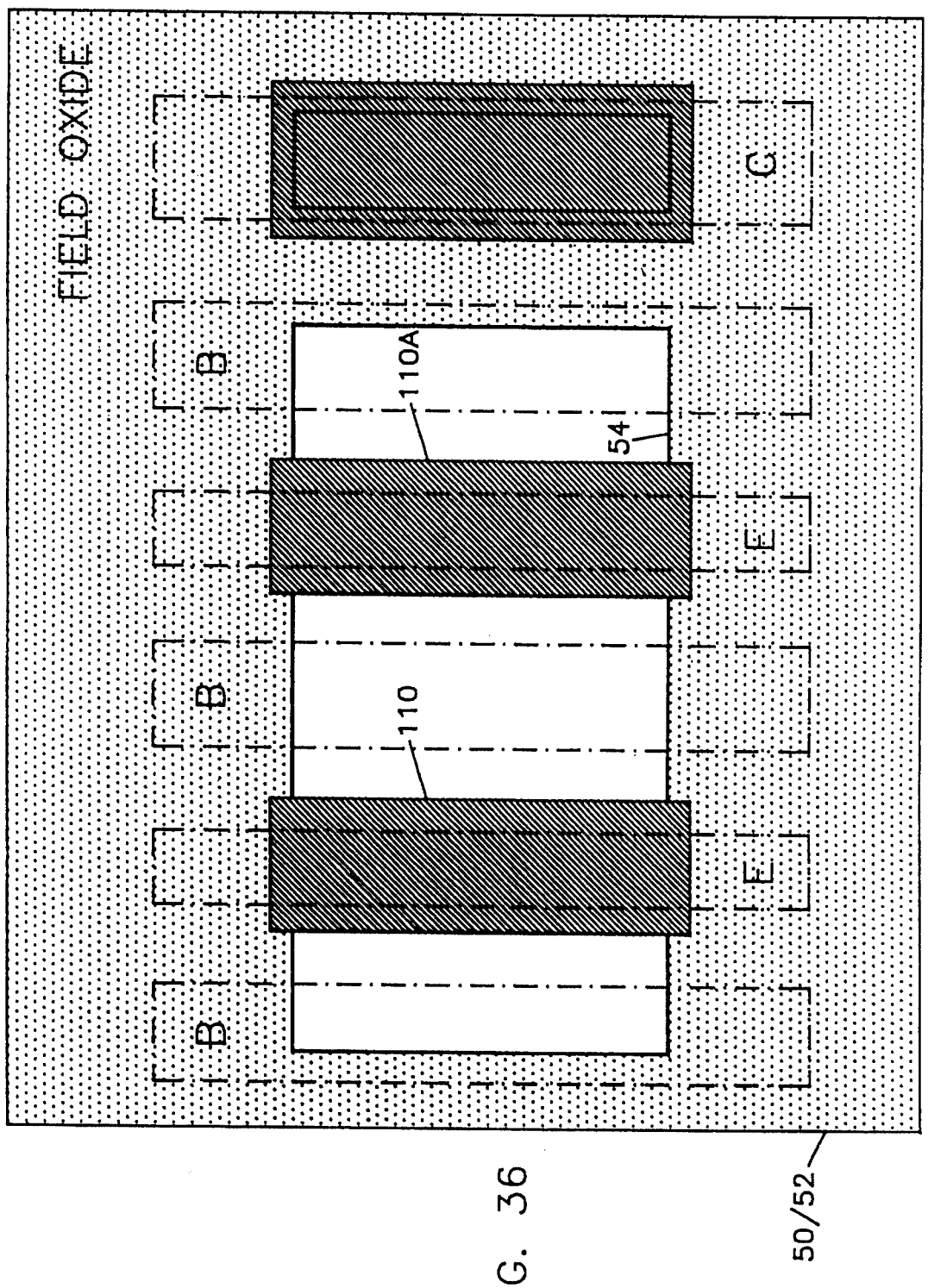
FIGS. 36, 37, 38, and 39 are partial mask layout views respectively corresponding to the partial transistor layout views of FIGS. 30, 32, 33, and 35.
Figure 37:
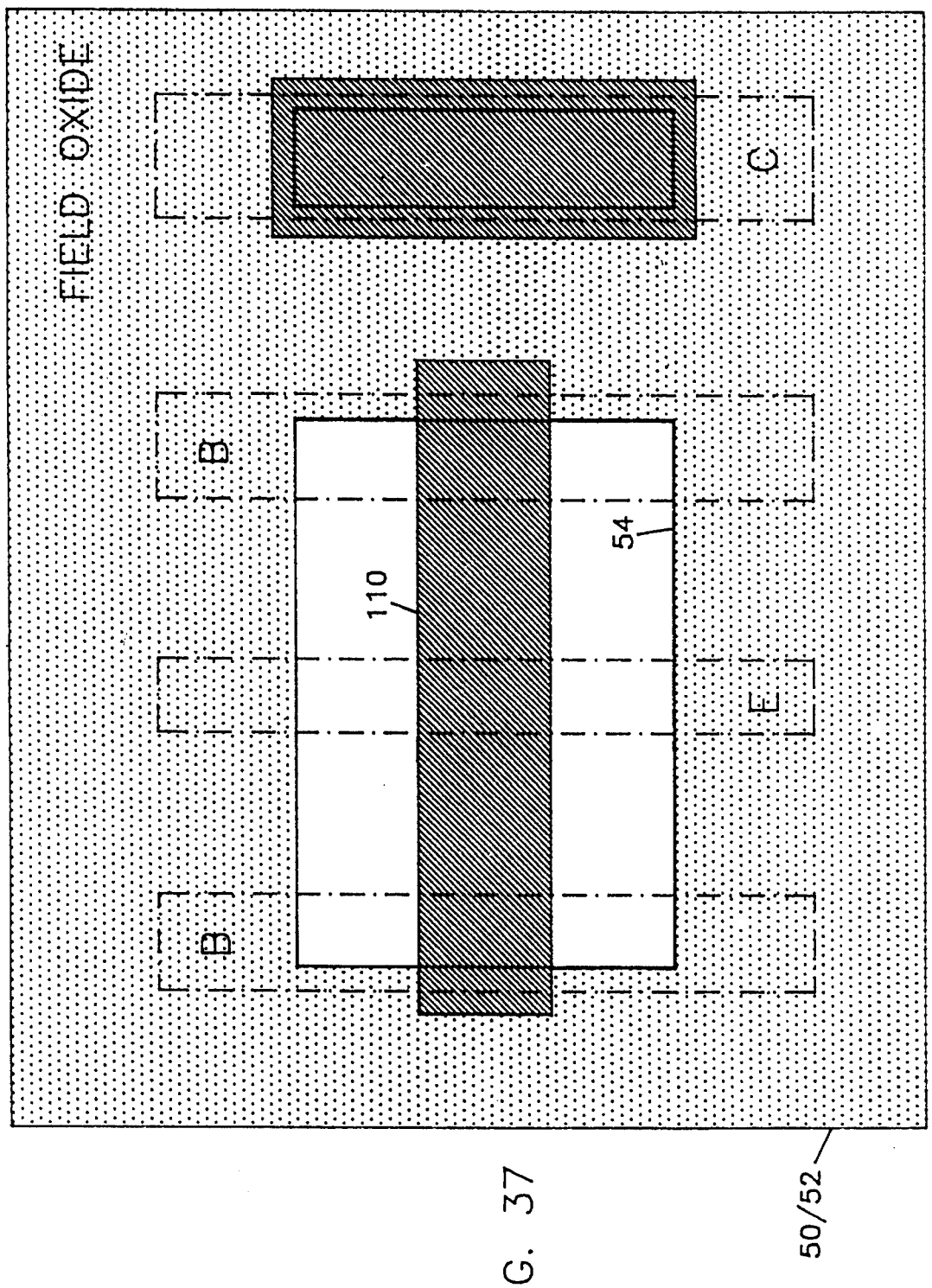
Figure 38:
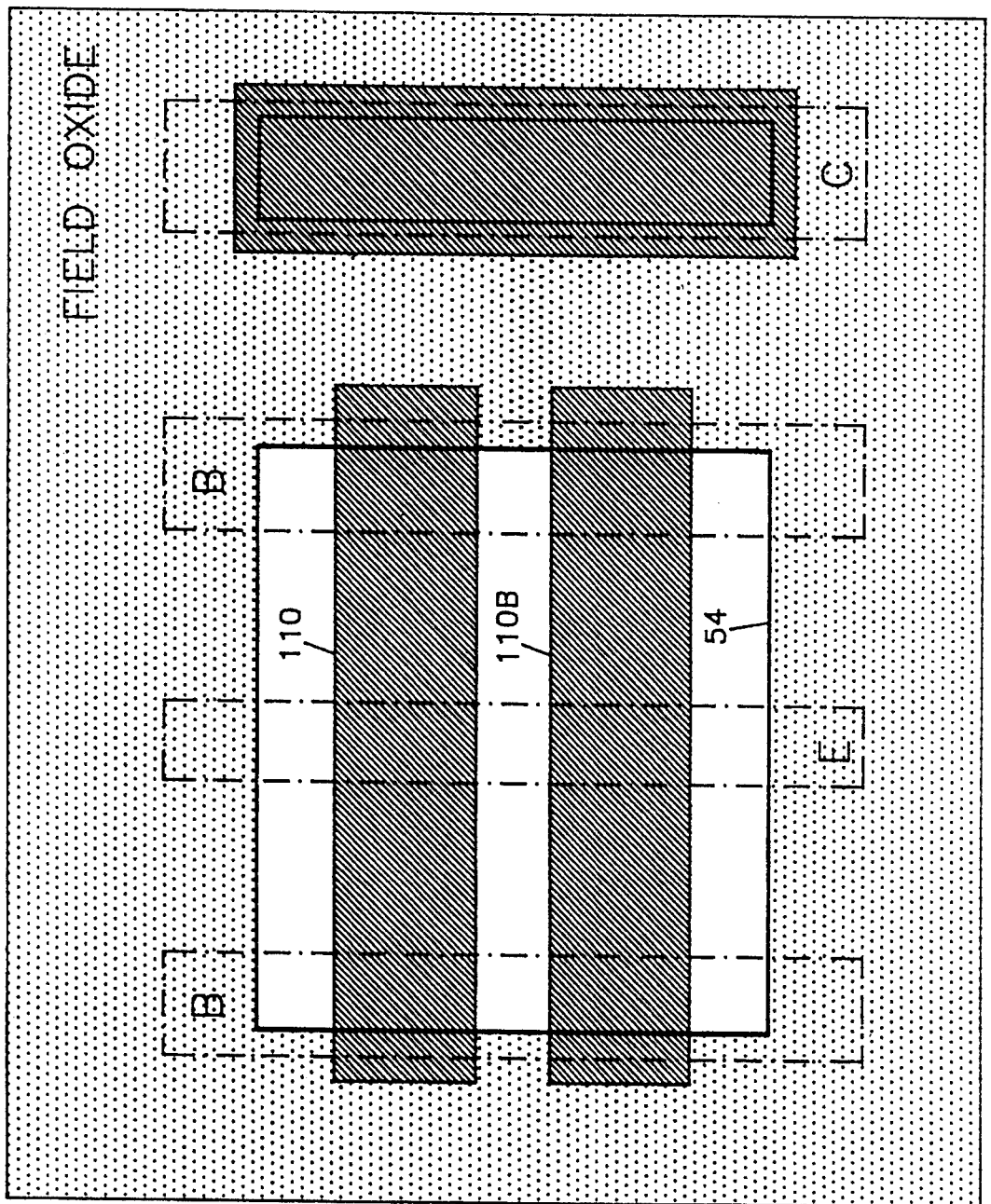
Figure 39:
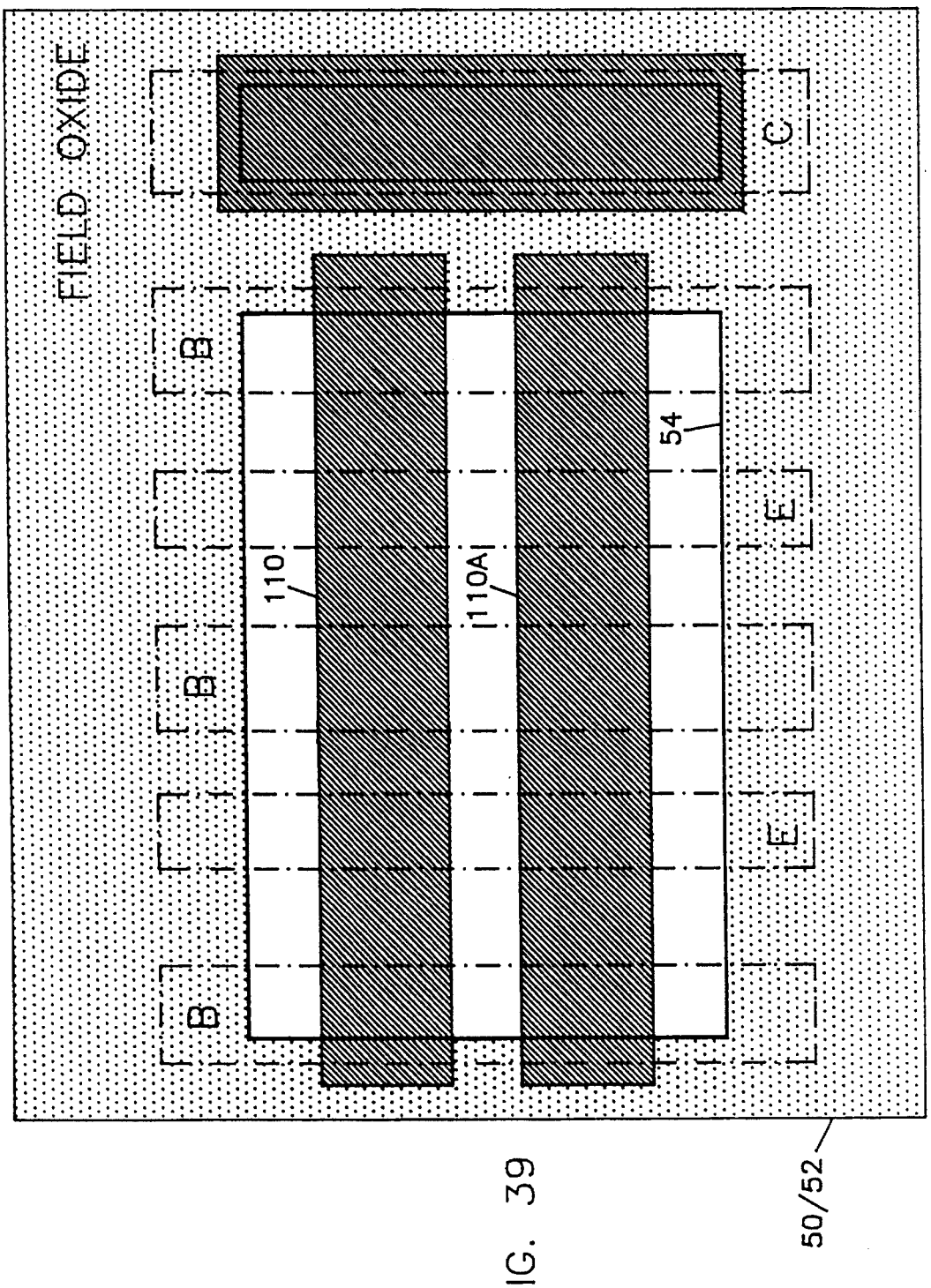

FIG. 35 illustrates an expansion of the layout of FIG. 33 to include additional emitter stripe 58A. The cross section of FIG. 34 applies to the layout of FIG. 35. In addition to encroaching base portion 66A, the transistor of FIGS. 35 and 36 has an additional intrinsic base and thus an additional main intrinsic base portion 64MA. The layout of FIG. 35 is basically a combination of the layouts of FIGS. 30 and 33. Spacings $S_{NE}$ and $S_{NEB}$ thus both meet the requirements given above for the transistor of FIGS. 30 and 31 and the transistor of FIGS. 33 and 34.

The fabrication process of FIG. 28 or 29 can be employed to fabricate the transistor of FIGS. 30 and 31. The transistors of FIGS. 32–35 can be manufactured according to the process variation of FIG. 30 where the encroaching-base dopant is typically boron since the encroaching-base dopant is introduced into epitaxial layer 52 prior to beginning the formation of base layer 64, emitter 58, and base contact zones 68.

FIGS. 36–39 illustrate partial mask layouts respectively for the transistor layouts of FIGS. 30, 32, 33, and 35. These mask layouts are suitable for the process variation of FIG. 29. Items 110, 110A, and 110B in FIGS. 36–39 are masks that are respectively used to define spacings $S_{NE}$, $S_{NEA}$, and $S_{NEB}$. The letters "E", "B", "C" indicate the minimum areas where the mask material must be present when etching the polysilicon layer to define the emitter, base, and collector contacts. Although not indicated in FIGS. 36–39, the polysilicon base contacts in each of the layouts typically connect to one another.

The polysilicon emitter-stripe contacts in the transistor of FIGS. 30 and 31 and in the transistor of FIGS. 34 and 35 can all be connected together. Additional such emitter stripe arrangements can be utilized to produce a power transistor. Alternatively, the emitter stripes can be left unconnected, thereby producing a multiple-emitter transistor.

While the invention has been described with reference to particular embodiments, this description is solely for the purpose of illustration and is not to be construed as limiting the scope of the invention claimed below. For example, instead of using a fast-diffusing species to create deep encroaching base portions 66 in the process of FIG. 28, encroaching base portions 66 can be formed by implanting boron deep into epitaxial layer 52 and then performing a suitably shortened anneal to drive the boron laterally outward to the desired positions for encroaching base portions 66. Semiconductor materials of opposite conductivity type to those described above can be utilized to achieve the same results as given in the above text.

The invention can be applied to high-voltage transistors fabricated on substrates having substantially higher resistivity than that of substrate 50 here. The pn-junction depths, minimum base thickness $t_{BMIN}$, and minimum non-encroached spacing $S_{NE}$ are greater than in the exemplary transistors described above. Nonetheless, parameters $t_{BMIN}$ and $S_{NE}$ still satisfy the relationships given above. Various modifications and applications may thus be made by those skilled in the art without departing from the true scope and spirit of the invention as defined in the appended claims.

We claim:

1. A bipolar transistor comprising:

an emitter situated in a semiconductor body and extending to an upper surface of the semiconductor body;

a collector situated in the semiconductor body and comprising a main collector region; and a base situated in the semiconductor body between the emitter and the collector, the base comprising (a) a main intrinsic portion located below the emitter and above the main collector region and (b) a pair of encroaching base portions that are continuous with the main intrinsic base portion, have a lighter doping than the main intrinsic base portion, extend deeper into the semiconductor body than the main intrinsic base portion, extend below corresponding parts of the main intrinsic base portion, extend laterally outward beyond the emitter, and are laterally separated from each other below the main intrinsic base portion by a minimum spacing $S_{NE}$ which is less than three times the minimum distance $t_{BMIN}$ by which the main intrinsic base portion vertically separates the emitter and the main collector region.

2. A transistor as in claim 1 wherein the encroaching base portions extend sufficiently close to each other below the main intrinsic base portion to improve the transistor's output current-voltage characteristics.

3. A transistor as in claim 2 wherein the transistor has a collector-to-emitter punch-through voltage where magnitude is more than 20% greater than the value that would exist in the absence of the encroaching base portions.

4. A transistor as in claim 2 wherein $S_{NE}$ is less than twice $t_{BMIN}$.

5. A transistor as in claim 2 wherein, as viewed in a direction generally perpendicular to the upper surface of the semiconductor body, the emitter is generally in the shape of a stripe of length greater than width, each encroaching base portion having a side edge that lies below the stripe and extends generally along the length of the stripe.

6. A transistor as in claim 2 wherein, as viewed in a direction generally perpendicular to the upper surface of the semiconductor body, the emitter is generally in the shape of a stripe of length greater than width, each encroaching base portion having a side edge that lies below part of the stripe and extends fully across its width.

7. A transistor as in claim 6 wherein, as viewed in the direction generally perpendicular to the upper surface of the semiconductor body, the side edges of each encroaching base portion extend generally perpendicular to the length of the stripe.

8. A transistor as in claim 2 wherein the emitter and base are laterally surrounded by an electrical insulating region recessed into the upper surface of the semiconductor body.

9. A transistor as in claim 2 wherein the base further includes a pair of base contact zones respectively corresponding to the encroaching base portions, each base contact zone being continuous with the corresponding encroaching base portion, having a greater doping than the main intrinsic base portion, and being laterally spaced apart from the emitter.

10. A transistor as in claim 2 wherein current generally flows vertically between the emitter and collector.

11. A transistor as in claim 2 wherein, as viewed in a direction generally perpendicular to the upper surface of the semiconductor body, the encroaching base portions are separated by an area generally in the shape of a parallelogram below the emitter.

12. A transistor as in claim 2 wherein $S_{NE}$ is less than $1.5t_{BMIN}$.

13. A transistor as in claim 1 further including an additional emitter situated in the semiconductor body and extending to its upper surface, the base further including an additional main intrinsic base portion located below the additional emitter and above the main collector region.

14. A transistor as in claim 13 wherein the base further includes an additional encroaching base portion where the additional encroaching base portion and a specified one of the other encroaching base portions are continuous with the additional main intrinsic base portion, have a lighter doping than the additional main intrinsic base portion, extend deeper into the semiconductor body than the additional main intrinsic base portion, extend below corresponding parts of the additional main intrinsic base portion, extend laterally outward beyond the additional emitter, and are laterally separated from each other below the additional main intrinsic base portion by a minimum spacing $S_{NEA}$ which is less than three times the minimum distance $t_{BMINA}$ by which the additional main intrinsic base portion vertically separates the additional emitter from the main collector region.

15. A transistor as in claim 14 wherein $S_{NEA}$ and $t_{BMINA}$ respectively largely equal $S_{NEA}$ and $t_{BMIN}$, whereby $S_{NEA}/t_{BMINA}$ largely equals $S_{NE}/t_{BMIN}$.

16. A transistor in claim 14 wherein, as viewed in a direction generally perpendicular to the upper surface of the semiconductor body, each emitter is generally in the shape of a stripe of length greater than width, the specified encroaching base portion having two opposing side edges that respectively lie below the stripes and respectively extend generally along the lengths of the stripes.

17. A transistor as in claim 1 wherein the base further includes an additional encroaching base portion which is continuous with the main intrinsic base portion, has a lighter doping than the main intrinsic base portion, extends deeper into the substrate than the main intrinsic base portion, extends below a corresponding part of the main intrinsic base portion, and extends laterally outward beyond the emitter, the additional encroaching base portion and a specified one of the other encroaching base portions being laterally separated from each other below the main intrinsic base portion by a minimum spacing $S_{NEB}$ which is less than three times $t_{BMIN}$.

18. A transistor as in claim 17 wherein $S_{NEB}$ is largely equal to $S_{NE}$, whereby $S_{NEB}/t_{BMIN}$ largely equals $S_{NE}/t_{BMIN}$.

19. A transistor as in claim 17 wherein, as viewed in a direction generally perpendicular to the upper surface of the semiconductor body, the emitter is generally in the shape of a stripe of length greater than width, each encroaching base portion having a side edge that lies below part of the stripe and extends fully across its width.

20. A transistor as in claim 17 further including an additional emitter situated in the semiconductor body and extending to its upper surface, the base further including an additional main intrinsic base portion located below the additional emitter and above the main collector region.

21. A transistor as in claim 20 wherein each of the encroaching base portions is continuous with the additional main intrinsic base portion, has a lighter doping than the additional main intrinsic base portion, extends deeper into the semiconductor body than the additional main intrinsic base portion, extends below a corresponding part of the additional main intrinsic base portion, and extends laterally outward beyond the additional emitter, each pair of consecutive encroaching base portions being laterally separated from each other below the additional main intrinsic base portion by a minimum spacing which is less than three times the minimum distance by which the main intrinsic base portion vertically separates the additional emitter from the main collector region.

22. A transistor as in claim 21 wherein, as viewed in a direction generally perpendicular to the upper surface of a semiconductor body, each emitter is generally in the shape of a stripe of length greater than width, each encroaching base portion having a side edge that lies below part of each stripe and extends fully across its width.

\* \* \* \* \*